(12) United States Patent
Park et al.

(10) Patent No.: US 12,176,245 B2
(45) Date of Patent: Dec. 24, 2024

(54) SEMICONDUCTOR CHIP STRUCTURE

(71) Applicant: SAMSUNG ELECTRONICS CO., LTD., Suwon-si (KR)

(72) Inventors: Sangjun Park, Yongin-si (KR); Byungkyu Kim, Seoul (KR); Eunji Kim, Seoul (KR); Seungwoo Paek, Yongin-si (KR); Sungdong Cho, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 351 days.

(21) Appl. No.: 17/453,504

(22) Filed: Nov. 4, 2021

(65) Prior Publication Data

US 2022/0285208 A1 Sep. 8, 2022

(30) Foreign Application Priority Data

Mar. 8, 2021 (KR) ........................ 10-2021-0030375

(51) Int. Cl.
*H01L 23/522* (2006.01)
*H01L 21/768* (2006.01)
(Continued)

(52) U.S. Cl.
CPC .. *H01L 21/76819* (2013.01); *H01L 21/76834* (2013.01); *H01L 21/7685* (2013.01);
(Continued)

(58) Field of Classification Search
CPC ......... H01L 21/76819; H01L 21/76834; H01L 21/76837; H01L 21/7685; H01L 21/76885;
(Continued)

(56) References Cited

U.S. PATENT DOCUMENTS 8,053,900 B2 * 11/2011 Yu ........................... H01L 24/05
257/777
8,546,188 B2 * 10/2013 Liu ........................ H01L 23/481
438/455

(Continued)

FOREIGN PATENT DOCUMENTS

| CN | 102867847 A | * | 9/2013 | ........... H01L 21/185 |
| JP | 2001-217309 | | 8/2001 | |

(Continued)

*Primary Examiner* — Telly D Green
(74) *Attorney, Agent, or Firm* — F. CHAU & ASSOCIATES, LLC

(57) ABSTRACT

A semiconductor chip structure includes a first semiconductor chip that includes a first chip region and a first scribe lane region and a second semiconductor chip that includes a second chip region and a second scribe lane region respectively bonded to the first chip region and the first scribe lane region. The first semiconductor chip includes a first bonding wiring layer that includes a first bonding insulating layer and a first bonding electrode in the first bonding insulating layer. The second semiconductor chip includes a second bonding wiring layer that includes a second bonding insulating layer and a second bonding electrode in the second bonding insulating layer and a polishing stop pattern. The first bonding insulating layer and the first bonding electrode of the first bonding wiring layer are respectively hybrid bonded to the second bonding insulating layer and the second bonding electrode of the second bonding wiring layer.

16 Claims, 30 Drawing Sheets

(51) Int. Cl.
*H01L 23/00* (2006.01)
*H01L 25/065* (2023.01)
*H01L 25/18* (2023.01)

(52) U.S. Cl.
CPC .... *H01L 21/76885* (2013.01); *H01L 23/5226* (2013.01); *H01L 25/0657* (2013.01); *H01L 25/18* (2013.01); *H01L 24/05* (2013.01); *H01L 24/08* (2013.01); *H01L 24/29* (2013.01); *H01L 24/32* (2013.01); *H01L 24/94* (2013.01); *H01L 2224/05018* (2013.01); *H01L 2224/05073* (2013.01); *H01L 2224/05166* (2013.01); *H01L 2224/05181* (2013.01); *H01L 2224/05186* (2013.01); *H01L 2224/05559* (2013.01); *H01L 2224/05647* (2013.01); *H01L 2224/08145* (2013.01); *H01L 2224/29186* (2013.01); *H01L 2224/32145* (2013.01); *H01L 2225/0651* (2013.01); *H01L 2225/06517* (2013.01)

(58) Field of Classification Search
CPC ..... H01L 2224/034; H01L 2224/03616; H01L 2224/04042; H01L 2224/05018; H01L 2224/05073; H01L 2224/05166; H01L 2224/05181; H01L 2224/05186; H01L 2224/05546; H01L 2224/05547; H01L 2224/05556; H01L 2224/05559; H01L 2224/05647; H01L 2224/08058; H01L 2224/08145; H01L 2224/16238; H01L 2224/29186; H01L 2224/32145; H01L 2224/48227; H01L 2224/48229; H01L 2224/80097; H01L 2224/80357; H01L 2224/80379; H01L 2224/80895; H01L 2224/80896; H01L 2225/0651; H01L 2225/06517; H01L 23/5226; H01L 23/585; H01L 24/05; H01L 24/08; H01L 24/29; H01L 24/32; H01L 24/80; H01L 24/94; H01L 25/0657; H01L 25/18; H01L 2924/00014; H10B 43/40
See application file for complete search history.

(56) References Cited

U.S. PATENT DOCUMENTS

| | | | |
|---|---|---|---|
| 8,772,072 | B2 | 7/2014 | Pyo |
| 8,802,538 | B1 | 8/2014 | Liu et al. |
| 9,991,244 | B2 * | 6/2018 | Lin ........................ H01L 23/481 |
| 10,020,338 | B2 * | 7/2018 | Hynecek ........... H01L 27/14698 |
| 10,354,972 | B2 | 7/2019 | Liu et al. |
| 10,950,578 | B2 * | 3/2021 | Lee ........................ H01L 24/09 |
| 11,362,065 | B2 * | 6/2022 | Chen ....................... H01L 28/60 |
| 11,373,981 | B2 * | 6/2022 | Chen ....................... H01L 24/08 |
| 11,393,873 | B2 * | 7/2022 | Lee ........................ H10N 50/85 |
| 11,469,268 | B2 * | 10/2022 | Lee ........................ H10B 61/20 |
| 2012/0306095 | A1 * | 12/2012 | Han ..................... H01L 23/481 |
| | | | 257/774 |
| 2013/0285253 | A1 * | 10/2013 | Aoki ...................... H01L 21/82 |
| | | | 438/455 |
| 2015/0294963 | A1 * | 10/2015 | Lin ........................ H01L 25/50 |
| | | | 438/107 |
| 2017/0154873 | A1 * | 6/2017 | Kim ...................... H01L 24/73 |
| 2019/0006416 | A1 * | 1/2019 | Lee ........................ H10N 59/00 |
| 2019/0013353 | A1 * | 1/2019 | Lee ........................ H10B 61/22 |
| 2019/0013354 | A1 * | 1/2019 | Lee ........................ G11C 11/161 |
| 2020/0066890 | A1 * | 2/2020 | Then ...................... H01L 29/402 |
| 2020/0135580 | A1 * | 4/2020 | Hsieh .................... H01L 21/762 |
| 2020/0152608 | A1 | 5/2020 | Hu et al. |
| 2020/0161277 | A1 * | 5/2020 | Lee ....................... H01L 23/481 |
| 2021/0066168 | A1 * | 3/2021 | Chen ....................... H01L 21/56 |
| 2021/0066248 | A1 * | 3/2021 | Chen ...................... H01L 21/561 |
| 2021/0265313 | A1 * | 8/2021 | Chen ...................... H01L 23/528 |
| 2021/0305214 | A1 * | 9/2021 | Chen ........................ H01L 24/95 |
| 2022/0139807 | A1 * | 5/2022 | Chen ........................ H01L 24/10 |
| | | | 257/774 |
| 2022/0262771 | A1 * | 8/2022 | Chen ..................... H01L 23/481 |
| 2022/0271012 | A1 * | 8/2022 | Chen ..................... H01L 21/561 |
| 2022/0302034 | A1 * | 9/2022 | Chen ..................... H01L 23/585 |

FOREIGN PATENT DOCUMENTS

| | | | | |
|---|---|---|---|---|
| JP | 5594862 | | 9/2014 | |
| TW | 202109781 A | * | 3/2021 | ........... H01L 21/463 |
| TW | 202109790 A | * | 3/2021 | ............. H01L 21/56 |
| TW | 202137475 A | * | 10/2021 | ........... H01L 21/561 |

* cited by examiner

SEMICONDUCTOR CHIP STRUCTURE

CROSS-REFERENCE TO RELATED APPLICATION

This application claims priority under 35 U.S.C. § 119 from Korean Patent Application No. 10-2021-0030375, filed on Mar. 8, 2021 in the Korean Intellectual Property Office, the contents of which are herein incorporated by reference in their entirety.

BACKGROUND

Technical Field

Embodiments of the inventive concept are directed to a semiconductor chip structure, and more particularly, to a semiconductor chip structure in which a first semiconductor chip and a second semiconductor chip are bonded to each other.

Discussion of the Related Art

As semiconductor chips have become highly integrated, a semiconductor chip structure has been proposed in which a first semiconductor chip is bonded to a second semiconductor chip. A semiconductor chip structure constructed by bonding the first semiconductor chip to the second semiconductor chip should have good bonding reliability. When the bonding reliability is not good, the semiconductor chip structure might not implement the function or performance of the first semiconductor chip or the second semiconductor chip. In semiconductor chips used in a conventional semiconductor chip structure, an uppermost final wiring pattern may have a step difference between a chip region and a scribe lane region. Accordingly, semiconductor chips used in a conventional semiconductor chip structure may not properly bond to each other.

SUMMARY

Embodiments of the inventive concept provide a semiconductor chip structure with improved bonding reliability between a first semiconductor chip and a second semiconductor chip.

According to an embodiment of the inventive concept, there is provided a semiconductor chip structure that includes a first semiconductor chip that includes a first chip region and a first scribe lane region, and a second semiconductor chip that includes a second chip region and a second scribe lane region respectively bonded to the first chip region and the first scribe lane region on the first semiconductor chip.

The first semiconductor chip further includes: a first final wiring layer that includes a first final wiring pattern and a first passivation layer that insulates the first final wiring pattern, and a first bonding wiring layer formed on the first final wiring layer. The first bonding wiring layer includes a first bonding insulating layer and a first bonding electrode formed in the first bonding insulating layer.

The second semiconductor chip further includes: a second final wiring layer that includes a second final wiring pattern, a polishing stop pattern formed on the second final wiring pattern, and a second passivation layer that insulates both the second final wiring pattern and the polishing stop pattern, and a second bonding wiring layer formed on the second final wiring layer. The second bonding wiring layer includes a second bonding insulating layer and a second bonding electrode formed in the second bonding insulating layer and the polishing stop pattern.

In a semiconductor chip structure, the first bonding insulating layer and the first bonding electrode in the first bonding wiring layer are respectively hybrid bonded to the second bonding insulating layer and the second bonding electrode in the second bonding wiring layer.

According to an embodiment of the inventive concept, there is provided a semiconductor chip structure that includes a first semiconductor chip that includes a first chip region and a first scribe lane region, and a second semiconductor chip that includes a second chip region and a second scribe lane region respectively bonded to the first chip region and the first scribe lane region on the first semiconductor chip.

The first semiconductor chip further includes: a first circuit layer formed on the first chip region and the first scribe lane region; a first final wiring layer formed on the first circuit layer, where the first final wiring layer includes a first final wiring pattern and a first passivation layer that insulates the first final wiring pattern; and a first bonding wiring layer formed on the first final wiring layer. The first bonding wiring layer includes a first interlayer insulating layer, a first bonding insulating layer formed on the first interlayer insulating layer, and a first bonding electrode formed in the first interlayer insulating layer and the first bonding insulating layer.

The second semiconductor chip further includes: a second circuit layer formed on the second chip region and the second scribe lane region; a second final wiring layer formed on the second circuit layer, where the second final wiring layer includes a second final wiring pattern, a polishing stop pattern formed on the second final wiring pattern, and a second passivation layer that insulates both the second final wiring pattern and the polishing stop pattern; and a second bonding wiring layer formed on the second final wiring layer, where the second bonding wiring layer includes a second interlayer insulating layer, a second bonding insulating layer formed on the second interlayer insulating layer, and a second bonding electrode formed in the second interlayer insulating layer and the polishing stop pattern.

In the semiconductor chip structure, the first bonding insulating layer and the first bonding electrode in the first bonding wiring layer are respectively hybrid bonded to the second bonding insulating layer and the second bonding electrode in the second bonding wiring layer.

According to an embodiment of the inventive concept, there is provided a semiconductor chip structure that includes a first semiconductor chip that includes a first chip region and a first scribe lane region, and a second semiconductor chip that includes a second chip region and a second scribe lane region respectively bonded to the first chip region and the first scribe lane region on the first semiconductor chip.

The first semiconductor chip further includes: a first circuit layer formed on the first chip region and the first scribe lane region of a first substrate; a first final wiring layer formed on the first circuit layer, where the first final wiring layer includes a first final wiring pattern and a first passivation layer that insulates the first final wiring pattern; and a first bonding wiring layer formed on the first final wiring layer. The first bonding wiring layer includes a first interlayer insulating layer, a first bonding insulating layer formed on the first interlayer insulating layer, and a first bonding electrode formed in the first interlayer insulating layer and the first bonding insulating layer.

The second semiconductor chip further includes: a second circuit layer formed on the second chip region and the second scribe lane region of a second substrate; a second final wiring layer formed on the second circuit layer, where the second final wiring layer includes a second final wiring pattern, a polishing stop pattern formed on the second final wiring pattern, and a second passivation layer that insulates both the second final wiring pattern and the polishing stop pattern; a reinforcing bonding wiring layer that includes a reinforcing insulating layer formed on the second final wiring layer; and a second bonding wiring layer formed on the reinforcing bonding wiring layer. The second bonding wiring layer includes a second interlayer insulating layer, a second bonding insulating layer formed on the second interlayer insulating layer, and a second bonding electrode formed in the second interlayer insulating layer, the reinforcing insulating layer and the polishing stop pattern.

In the semiconductor chip structure, the first bonding insulating layer and the first bonding electrode in the first bonding wiring layer are respectively hybrid bonded to the second bonding insulating layer and the second bonding electrode in the second bonding wiring layer.

DETAILED DESCRIPTION

Hereinafter, embodiments of the inventive concept will be described in detail with reference to the accompanying drawings. The following embodiments of the inventive concept may be implemented with one or a combination of two or more embodiments. Therefore, the inventive concept is not interpreted as being limited to one embodiment.

Figure 1:
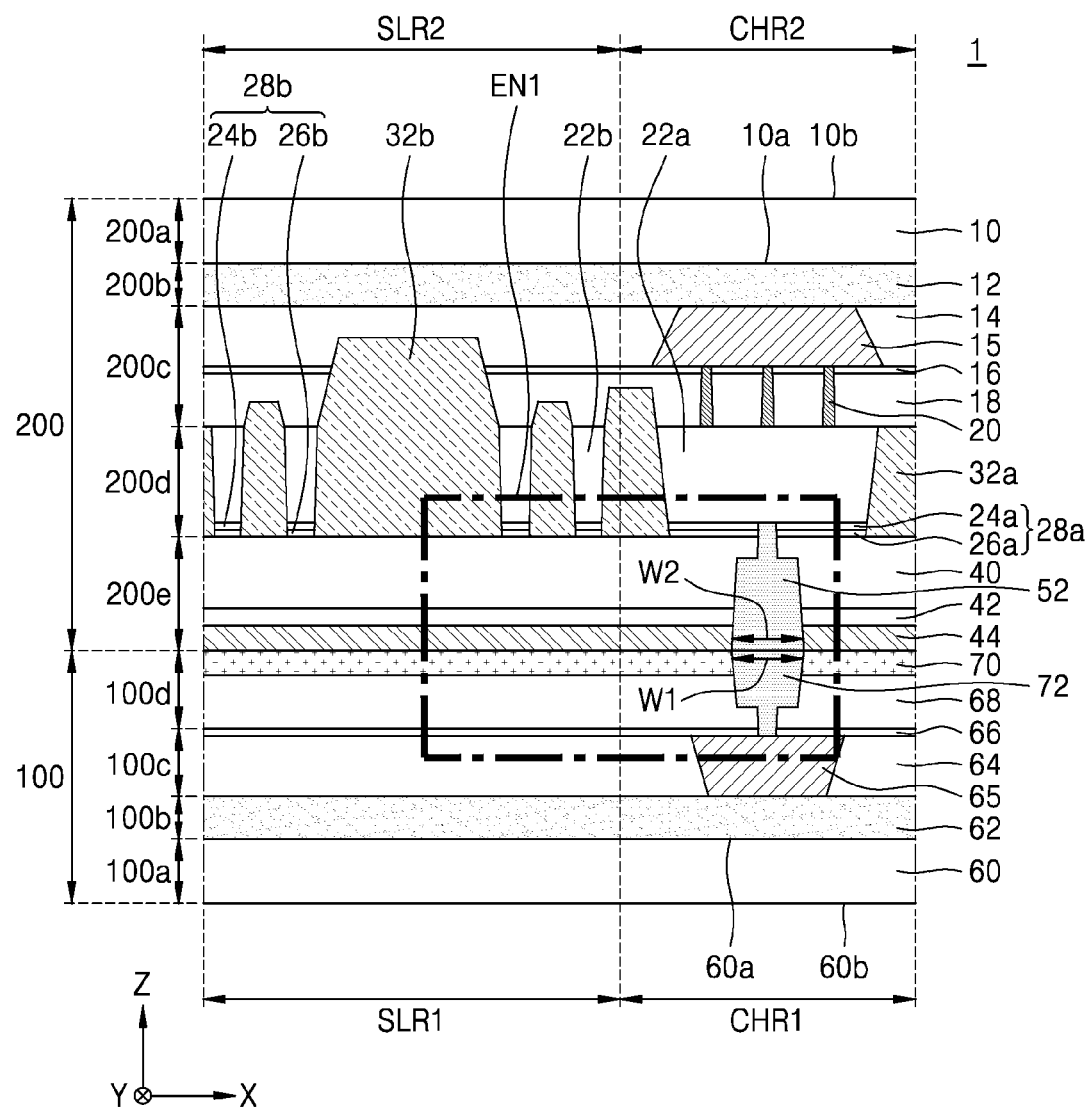
FIG. 1 is a cross-sectional view of a semiconductor chip structure according to an embodiment of the inventive concept.
Figure 2:
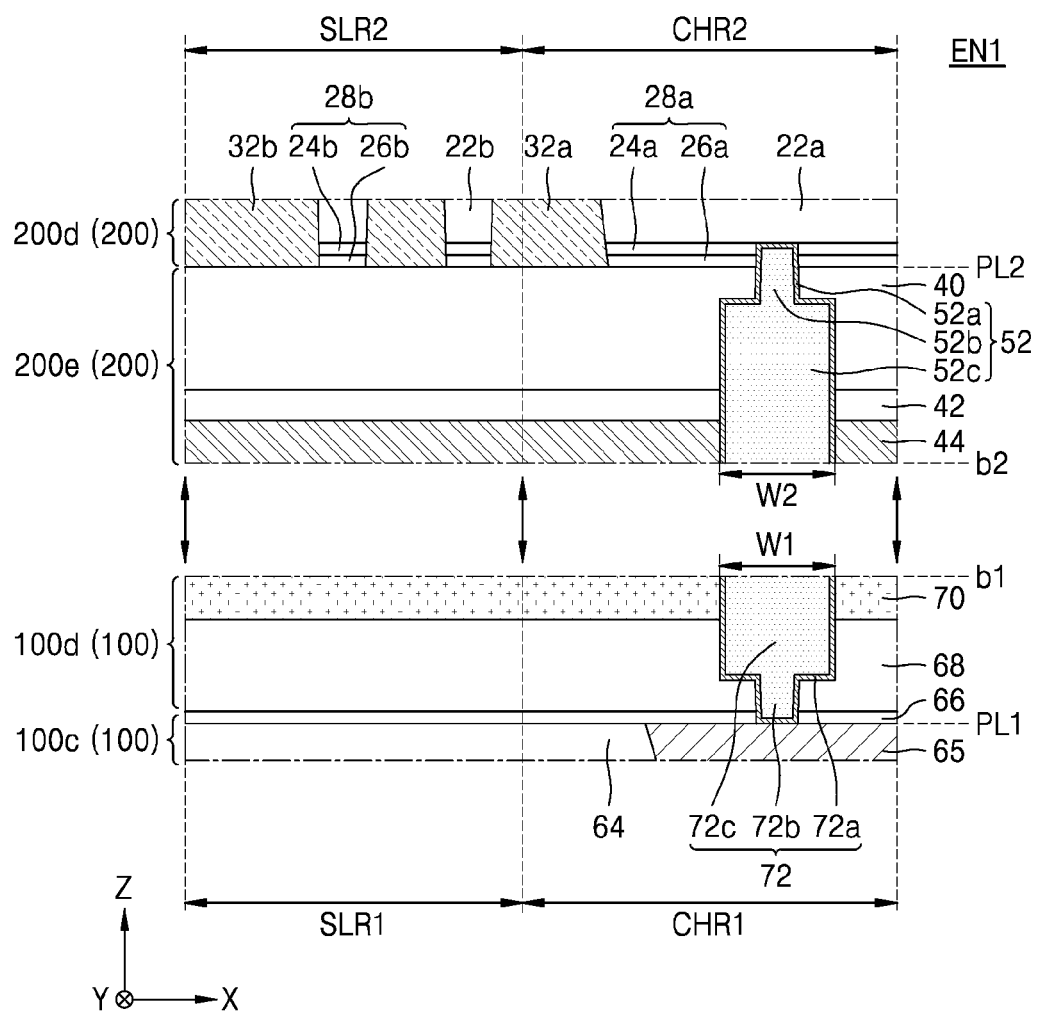
FIG. 2 is a partial cross-sectional view of a semiconductor chip structure of FIG. 1.

FIG. 1 is a cross-sectional view of a semiconductor chip structure according to an embodiment of the inventive concept, and FIG. 2 is a partial cross-sectional view of a semiconductor chip structure of FIG. 1.

Specifically, in FIGS. 1 and 2, an X direction and a Y direction are directions horizontal to a front surface 60a of a first substrate 60 and a front surface 10a of a second substrate 10. A Z direction is a direction perpendicular to the front surface 60a of the first substrate 60 and the front surface 10a of the second substrate 10, i.e., a plane defined by the X direction and the Y direction. FIG. 2 is an enlarged cross-sectional view of a portion EN1 of a semiconductor chip structure 1 of FIG. 1.

In some embodiments, the semiconductor chip structure 1 is constructed by bonding a second semiconductor chip 200 to a first semiconductor chip 100. The first semiconductor chip 100 is located in a lower portion of the semiconductor chip structure 1 and the second semiconductor chip 200 is located in an upper portion thereof, but embodiments of the inventive concept are not limited thereto. In other words, in other embodiments, the first semiconductor chip 100 is located in the upper portion and the second semiconductor chip 200 is located in the lower portion. For convenience of explanation, herein, an upper surface or the upper portion of the first substrate 60 is located in a positive (+) Z direction and an upper surface or the upper portion of the second substrate 10 is located in a negative (−) Z direction.

In some embodiments, the first semiconductor chip 100 includes a first chip region CHR1 and a first scribe lane region SLR1. The first chip region CHR1 is where circuit elements that constitute the first semiconductor chip 100, such as a transistor, a capacitor, a resistor, etc., are formed. The first scribe lane region SLR1 is made incidentally when the first chip region CHR1 is manufactured. No circuit elements are formed in the first scribe lane region SLR1.

In some embodiments, the second semiconductor chip 200 includes a second chip region CHR2 and a second scribe lane region SLR2. The second chip region CHR2 is where circuit elements that constitute the second semiconductor chip 200, such as a memory cell, are formed. In some embodiments, the second chip region CHR2 is where a vertical memory cell, such as a vertical NAND (VNAND) memory cell, is formed. The second scribe lane region SLR2 is made incidentally when the second chip region CHR2 is manufactured. No circuit elements are formed in the second scribe lane region SLR2.

In some embodiments, the semiconductor chip structure 1 is constructed by bonding the second semiconductor chip 200 to the first semiconductor chip 100, such that the second chip region CHR1 and the second scribe lane region SLR2 respectively correspond to the first chip region CHR1 and the first scribe lane region SLR1.

First, the components of the first semiconductor chip 100 and the second semiconductor chip 200 will be described in more detail.

More specifically, in some embodiments, the first semiconductor chip 100 includes a first substrate layer 100a, a first circuit layer 100b, a first final wiring layer 100c, and a first bonding wiring layer 100d. The first substrate layer 100a includes the first substrate 60. The first substrate 60 includes the front surface 60a and a back surface 60b located opposite to the surface 60a. The first substrate 60 is a silicon substrate. The first substrate 60 includes a silicon wafer. The first substrate 60 includes the first chip region CHR1 and the first scribe lane region SLR1.

In some embodiments, the first circuit layer 100b is formed on the first chip region CHR1 and the first scribe lane region SLR1 of the first substrate 60. The first circuit layer 100b includes a first circuit 62. The first circuit 62 is disposed on the surface 60a of the first substrate 60. The first circuit 62 is a peripheral circuit. The peripheral circuit includes a circuit element, such as a transistor.

In some embodiments, the first final wiring layer 100c is formed on the first circuit layer 100b. The first final wiring layer 100c includes a first final wiring pattern 65, a first passivation layer 64 that insulates the first final wiring pattern 65, and a first etch stop layer 66 formed on the first passivation layer 64 and the first final wiring pattern 65.

In some embodiments, the first final wiring pattern 65 is electrically connected to the first circuit 62. FIG. 1 shows that the first final wiring pattern 65 is directly connected to the first circuit 62, but the first final wiring pattern 65 may be connected to the first circuit 62 with an intermediate wiring pattern therebetween. The first final wiring pattern 65 includes a metal.

In some embodiments, the first final wiring pattern 65 includes a different metal from a first bonding electrode 72. In some embodiments, the first final wiring pattern 65 includes one or more of aluminum, copper, or tungsten, etc. In some embodiments, the first final wiring pattern 65 is a metal alloy that contains a base metal, such as aluminum, and an impurity element, such as silicon.

In some embodiments, the first passivation layer 64 insulates the first final wiring pattern 65. The first passivation layer 64 includes silicon oxide. The first passivation layer 64 includes silicon oxide formed by a high density plasma (HDP) method. The first etch stop layer 66 prevents the first final wiring pattern 65 from being damaged when the first bonding electrode 72 is formed. The first etch stop layer 66 is not formed, if not needed. The first etch stop layer 66 includes silicon nitride.

In some embodiments, the first bonding wiring layer 100d is formed on the first final wiring layer 100c. The first bonding wiring layer 100d includes a first interlayer insulating layer 68, a first bonding insulating layer 70, and the first bonding electrode 72. The first interlayer insulating layer 68 is located above the first passivation layer 64, the first final wiring pattern 65, and the first etch stop layer 66. The first interlayer insulating layer 68 includes silicon oxide. The first interlayer insulating layer 68 is formed by an HDP method.

In some embodiments, the first bonding insulating layer 70 is located on the first interlayer insulating layer 68. The first bonding insulating layer 70 includes at least one of a silicon carbon nitride (SiCN) film, a silicon oxycarbonitride (SiOCN) film, a silicon boron nitride (SiBN) film, a silicon oxide (SiO) film, or a boron nitride (BN) film. The first bonding electrode 72 is formed in the first interlayer insulating layer 68 and the first bonding insulating layer 70.

In some embodiments, the first bonding electrode 72 includes a metal, such as copper. The first bonding electrode 72 has different widths in upper and lower portions thereof separated in the Z direction. The first bonding electrode 72 is formed through a damascene process. In an embodiment, the first bonding electrode 72 is formed through a dual damascene process, as shown in FIG. 1. Alternatively, as needed, the first bonding electrode 72 is formed through a single damascene process, different from FIG. 1.

In some embodiments, the second semiconductor chip 200 includes a second substrate layer 200a, a second circuit layer 200b, an intermediate wiring layer 200c, a second final wiring layer 200d, and a second bonding wiring layer 200e. The second substrate layer 200a includes the second substrate 10. The second substrate 10 includes the front surface 10a and a back surface 10b located opposite to the surface 10a. The second substrate 10 is a silicon substrate. The second substrate 10 includes a silicon wafer. The second substrate 10 includes the second chip region CHR2 and the second scribe lane region SLR2.

In some embodiments, the second circuit layer 200b is formed on the second chip region CHR2 and the second scribe lane region SLR2 of the second substrate 10. The second circuit layer 200b includes a second circuit 12. The second circuit 12 is positioned on the surface 10a of the second substrate 10. The second circuit 12 is driven by the first circuit 62.

In some embodiments, the second circuit 12 includes a memory cell. When the first circuit 62 and the second circuit 12 are separated in the semiconductor chip structure 1, thermal stress applied during the formation of the first circuit 62 and the second circuit 12 can be minimized.

In some embodiments, the intermediate wiring layer 200c is formed on the second circuit layer 200b. The intermediate wiring layer 200c includes a first intermediate wiring insulating layer 14, an intermediate wiring pattern 15, a second etch stop layer 16, a second intermediate wiring insulating layer 18, and at least one intermediate wiring via 20. The intermediate wiring pattern 15 is electrically connected to the second circuit 12.

In some embodiments, the intermediate wiring pattern 15 is insulated by the first intermediate wiring insulating layer 14. The intermediate wiring via 20 is insulated by the second intermediate wiring insulating layer 18. The intermediate wiring via 20 is electrically connected to the intermediate wiring pattern 15. The intermediate wiring via 20 includes a plurality of via electrodes.

In some embodiments, the intermediate wiring pattern 15 and the intermediate wiring via 20 include a metal, such as aluminum, copper, or tungsten, etc. The first intermediate wiring insulating layer 14 and the second intermediate wiring insulating layer 18 include silicon oxide. The first intermediate wiring insulating layer 14 and the second intermediate wiring insulating layer 18 are formed by an HDP method.

In some embodiments, the second etch stop layer 16 prevents the intermediate wiring pattern 15 from being damaged when forming the intermediate wiring via 20. The first etch stop layer 16 is not formed, if not needed. The second etch stop layer 16 includes silicon nitride.

In some embodiments, the second final wiring layer 200d is formed on the intermediate wiring layer 200c. The second final wiring layer 200d includes second final wiring patterns 22a and 22b, polishing stop patterns 28a and 28b, and second passivation layers 32a and 32b. The second final wiring patterns 22a and 22b are electrically connected to the intermediate wiring pattern 15 through the intermediate wiring via 20.

In some embodiments, the second final wiring patterns 22a and 22b include the second final wiring pattern 22a formed in the second chip region CHR2 and the second final wiring pattern 22b formed in the second scribe lane region SLR2. A width of the second final wiring pattern 22a in the X direction is greater than a width of the second final wiring pattern 22b. The second final wiring patterns 22a and 22b include a metal.

In some embodiments, the second final wiring patterns 22a and 22b include a different metal from a second bonding electrode 52. In some embodiments, the second final wiring patterns 22a and 22b include one or more of aluminum, copper, or tungsten, etc. In some embodiments, the second final wiring patterns 22a and 22b are a metal alloy that contains a base metal, such as aluminum, and an impurity element, such as silicon.

In some embodiments, the polishing stop patterns 28a and 28b are formed on the second final wiring patterns 22a and 22b. The polishing stop patterns 28a and 28b prevent the second final wiring patterns 22a and 22b from being damaged during a polishing process, such as a chemical mechanical polishing process.

In some embodiments, the polishing stop patterns 28a and 28b include at least one of a metal pattern, an insulating pattern, or a combination thereof. In some embodiments, the polishing stop patterns 28a and 28b include a combination of metal patterns 24a and 24b and insulation patterns 26a and 26b, or a single pattern of either metal patterns 24a and 24b or insulation patterns 26a and 26b. In some embodiments, the metal patterns 24a and 24b are a single layer of Ti, Ta, or TiN, or a combination layer thereof. The insulating patterns 26a and 26b include silicon nitride.

In some embodiments, the polishing stop patterns 28a and 28b include the polishing stop pattern 28a formed in the second chip region CHR2 and the polishing stop pattern 28b formed in the second scribe lane region SLR2. A width in the X direction of the polishing stop pattern 28a is greater than a width of the polishing stop pattern 28b.

In some embodiments, the second passivation layers 32a and 32b insulate both the second final wiring patterns 22a and 22b and the polishing stop patterns 28a and 28b. The second passivation layers 32a and 32b include the passivation layer 32a formed in the second chip region CHR2 and the passivation layer 32b formed in the second scribe lane region SLR2.

In some embodiments, the second passivation layers 32a and 32b are also formed in, or extend into, the first intermediate wiring insulating layer 14 or the second intermediate wiring insulating layer 18 due to an over-etching process. The second passivation layers 32a and 32b include silicon oxide. The second passivation layers 32a and 32b are formed by an HDP method.

In some embodiments, the second bonding wiring layer 200e is formed on the second final wiring layer 200d. The second bonded wiring layer 200e includes a second interlayer insulating layer 40, an adhesive layer 42, a second bonding insulating layer 44, and the second bonding electrode 52. The second interlayer insulating layer 40 is located on the second passivation layers 32a and 32b and the polishing stop patterns 28a and 28b.

In some embodiments, the second interlayer insulating layer 68 includes silicon oxide. The adhesive layer 42 improves the adhesion between the second interlayer insulating layer 40 and the second bonding insulating layer 44. The adhesive layer 42 is not formed, if not needed. The adhesive layer 42 includes silicon oxide.

In some embodiments, the second bonding insulating layer 44 is formed on the second interlayer insulating layer 40 and the adhesive layer 42. The second bonding insulating layer 44 includes at least one of a silicon carbon nitride (SiCN) film, a silicon oxycarbonitride (SiOCN) film, a silicon boron nitride (SiBN) film, a silicon oxide (SiO) film, or a boron nitride (BN) film.

In some embodiments, the second bonding electrode 52 is formed in the second interlayer insulating layer 40, the adhesive layer 42, the second bonding insulating layer 44, and the polishing stop pattern 28a in the second chip region CHR2. The second bonding electrode 52 includes a metal, such as copper. The second bonding electrode 52 has different widths in upper and lower portions thereof, separated in the Z direction. The second bonding electrode 52 is formed through a damascene process. In an embodiment, the second bonding electrode 52 is formed through a dual damascene process as shown in FIG. 1. Alternatively, the second bonding electrode 52 can be formed through a single damascene process.

In some embodiments, the semiconductor chip structure 1 is constructed through a hybrid bonding of the first bonding insulating layer 70 and the first bonding electrode 72 in the first bonding wiring layer 100d with the second insulating layer 44 and the second bonding electrode 52 in the second bonding wiring layer 200e, respectively. Herein, with reference to the enlarged cross-sectional view of a portion EN1 of the semiconductor chip structure 1 shown in FIG. 2, a bonding configuration of the first semiconductor chip 100 and the second semiconductor chip 200 will be described in detail. In FIG. 2, for convenience of explanation, the first bonding electrode 72 and the second bonding electrode 52 are illustrated as having the same widths in Z direction at upper and lower portions thereof, respectively.

In the first semiconductor chip 100, in some embodiments, upper surfaces of the first final wiring pattern 65 and the first passivation layer 64 in the first final wiring layer 100c form a first flat surface PL1 in which there is no step difference between the first chip region CHR1 and the first scribe lane region SLR1. The first flat surface PL1 may be obtained by polishing, such as chemical mechanical polishing, the surfaces of the first final wiring pattern 65 and the first passivation layer 64.

In the first semiconductor chip 100, in some embodiments, upper surfaces of the first bonding electrode 72 and the first bonding insulating layer 70 in the first bonding wiring layer 100d form a first bonding surface b1 with no step difference between the first chip region CHR1 and the first scribe lane region SLR1. The first bonding surface b1 is a first flat bonding surface. The first bonding electrode 72 has a first width W1. The first bonding electrode 72 includes a first barrier metal layer 72a, a first via electrode 72b, and a first planar electrode 72c.

In some embodiments, the first barrier metal layer 72a is formed using one or more of Ti, Ta, TiN, or TaN. The first planar electrode 72c is electrically connected to the first via electrode 72b. In some embodiments, the first planar electrode 72c and the first via electrode 72b are formed using copper. The first barrier metal layer 72a, the first via electrode 72b, and the first planar electrode 72c are electrically connected to the first final wiring pattern 65.

In the second semiconductor chip 200, in some embodiments, upper surfaces of the polishing stop patterns 28a and 28b and the second passivation layers 32a and 32b in the second final wiring layer 200d form a second flat surface PL2 with no step difference between the second chip region CHR2 and the second scribe lane region SLR2.

In the second semiconductor chip 200, in some embodiments, upper surfaces of the second bonding electrode 52 and the second bonding insulating layer 44 in the second bonding wiring layer 200e form a second bonding surface b2 with no step difference between the second chip region CHR2 and the second scribe lane region SLR2. The second bonding surface b2 is a second flat bonding surface. An upper portion of the second bonding electrode 52 has a second width W2. The first width W1 of the upper portion of the first bonding electrode 72 is substantially equal to the second width W2 of the upper portion of the second bonding electrode 52. The second bonding electrode 52 includes a second barrier metal layer 52a, a second via electrode 52b, and a second planar electrode 52c.

In some embodiments, the second barrier metal layer 52a is formed using one or more of Ti, Ta, TiN, or TaN. The second planar electrode 52c is electrically connected to the second via electrode 52b. In some embodiments, the second planar electrode 52c and the second via electrode 52b are formed using copper. The second barrier metal layer 52a, the second via electrode 52b, and the second planar electrode 52c are electrically connected to the second final wiring pattern 22a of the second chip region CHR2.

In some embodiments, the first bonding surface b1 is directly bonded to the second bonding surface b2, so that the first bonding insulating layer 70 and the first bonding electrode 72 in the first bonding wiring layer 100d are respectively bonded to the second bonding insulating layer 44 and the second bonding electrode 52 in the second bonding wiring layer 200e, as indicated by the arrow of FIG. 2. Simultaneous bonding between the first bonding insulating layer 70 and the second bonding insulating layer 44 and between the first bonding electrode 72 and the second bonding electrode 52 may be referred to as a hybrid bonding.

In some embodiments, the hybrid bonding is performed by heat treatment while the first bonding insulating layer 70 and the second bonding insulating layer 44 are attached to each other and the first bonding electrode 72 and the second bonding electrode 52 are attached to each other. Both the first bonding surface b1 of the first bonded wiring layer 100d and the second bonding surface b2 of the second bonding wiring layer 200e are flat bonding surfaces, and therefore, the bonding reliability is improved during bonding of the first semiconductor chip 100 and the second semiconductor chip 200 in the semiconductor chip structure 1.

Figure 3A:
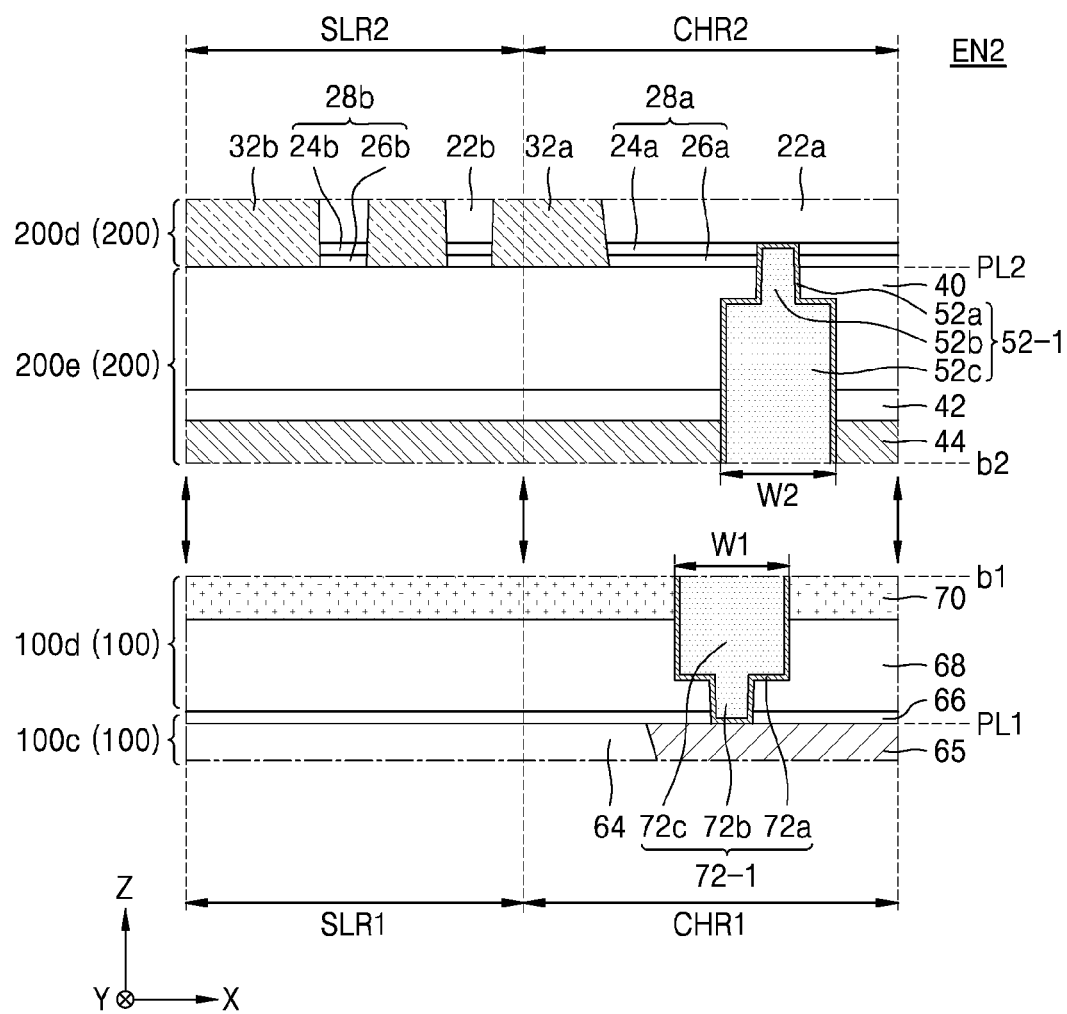
FIGS. 3A to 3C are partial cross-sectional views of a semiconductor chip structure according to an embodiment of the inventive concept.
Figure 3B:
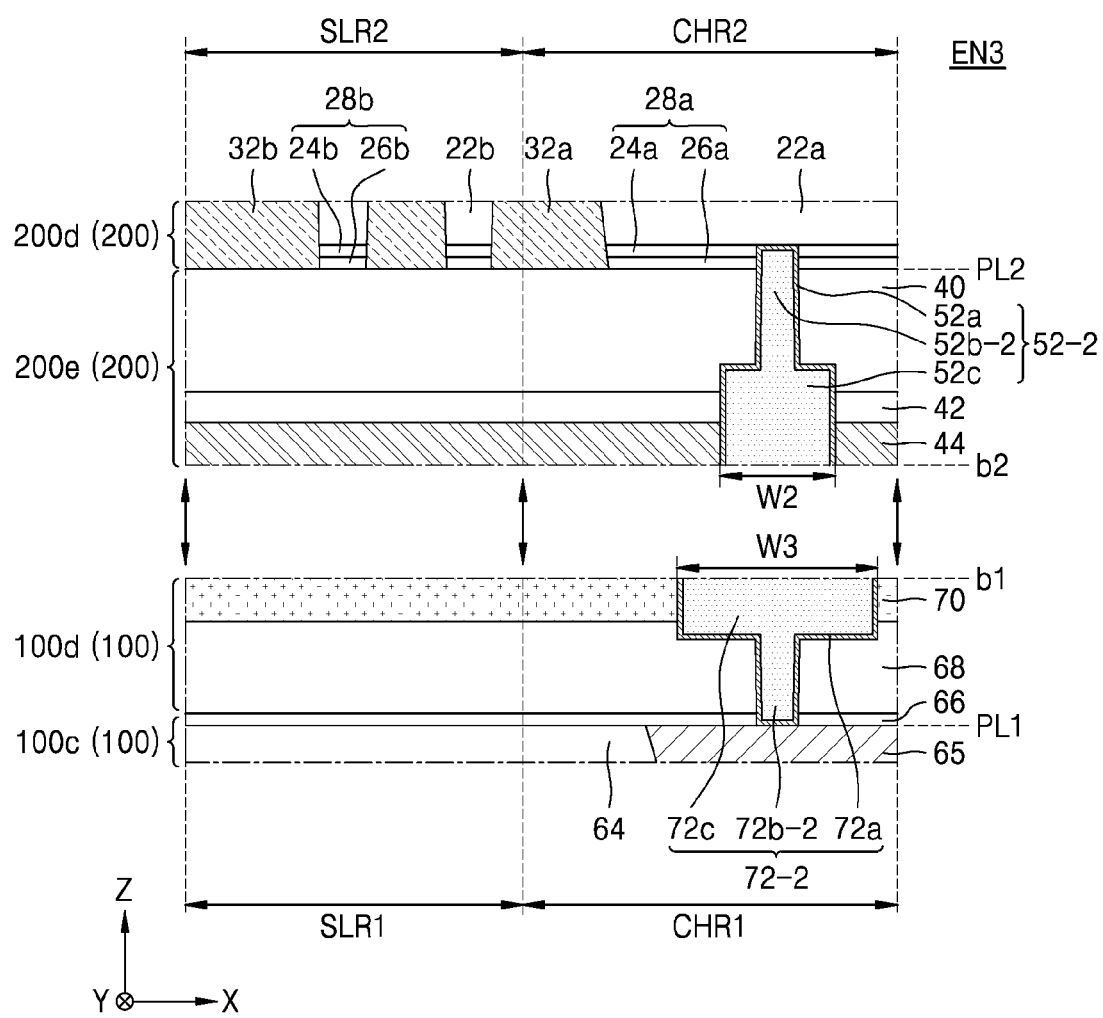
Figure 3C:
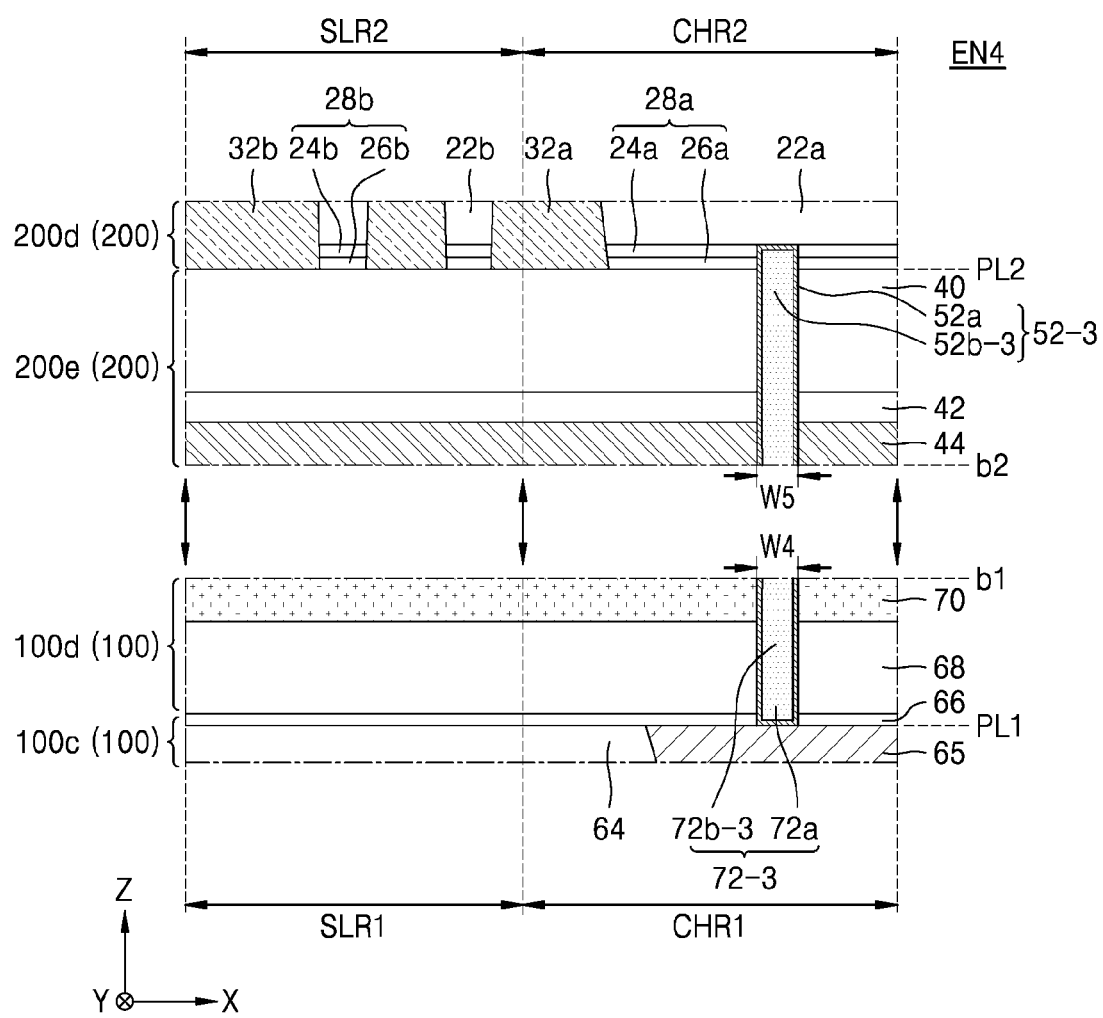

FIGS. 3A to 3C are partial cross-sectional views of a semiconductor chip structure according to an embodiment of the inventive concept.

Specifically, enlarged cross-sectional views of portions EN2, EN3, and EN4 of FIGS. 3A to 3C are modified examples of the enlarged cross-sectional view of the portion EN1 of the semiconductor chip structure 1 in FIGS. 1 and 2. In FIGS. 3A to 3C, the same reference numerals as those in FIGS. 1 and 2 will indicate the same members. In FIGS. 3A to 3C, descriptions of the same components as those shown in FIGS. 1 and 2 will be summarized or omitted.

Referring to FIG. 3A, in some embodiments, when comparing the enlarged cross-sectional view of the portion EN2 of the semiconductor chip structure 1 in FIG. 3A and the enlarged cross-sectional view of the portion EN1 of the semiconductor chip structure 1 in FIG. 2, the components are the same except that the first bonding electrode 72-1 of the semiconductor chip 100 is bonded to the second bonding electrode 52-1 of the second semiconductor chip 200 without being aligned in the Z direction, that is, a vertical direction.

In some embodiments, the first bonding wiring layer 100d of the first semiconductor chip 100 includes a first bonding electrode 72-1 and the first bonding insulating layer 70. The first bonding electrode 72-1 includes the first barrier metal layer 72a, the first via electrode 72b, and the first planar electrode 72c as described above.

In some embodiments, the second bonding wiring layer 200e of the second semiconductor chip 200 includes a second bonding electrode 52-1 and a second bonding insulating layer 44. The second bonding electrode 52-1 includes the second barrier metal layer 52a, the second via electrode 52b, and the second planar electrode 52c as described above.

As shown by the arrow of FIG. 3A, in some embodiments, when hybrid bonding the first bonding wiring layer 100d and the second bonding wiring layer 200e, the first bonding electrode 72-1 of the first semiconductor chip 100 is bonded to the second bonding electrode 52-1 of the second semiconductor chip 200 without being aligned in the Z direction, that is, the vertical direction.

Referring to FIG. 3B, in some embodiments, when comparing the enlarged cross-sectional view of the portion EN3 of the semiconductor chip structure 1 in FIG. 3B and the enlarged cross-sectional view of the portion EN2 in FIG. 3A, the components are the same except that a third width W3 of a first bonding electrode 72-2 and a shape of a first via electrode 72b-2 of a first bonding electrode 72-2 differ from those of a second via electrode 52b-2 of a second bonding electrode 52-2.

In some embodiments, the third width W3 of the first bonding electrode 72-2 is greater than the first width W1 of the first bonding electrode 72-1 in FIG. 3A. The first via electrode 72b-2 of the first bonding electrode 72-2 has a height in the Z direction that is greater than that of the first via electrode 72B of FIG. 3A in the Z direction. The second via electrode 52b-2 of the second bonding electrode 52-2 has a height in the Z direction that is greater than that of the second via electrode 52b of FIG. 3A.

As shown by the arrow of FIG. 3B, in some embodiments, when hybrid bonding the first bonding wiring layer 100d and the second bonding wiring layer 200e, the first bonding electrode 72-2 of the first semiconductor chip 100 and the second bonding electrode 52-2 of the second semiconductor chip 200 can be easily bonded in the Z direction, that is, the vertical direction, due to the relatively wide width W3 of the first bonding electrode 72-2 and the relatively narrow second width W2 of the second bonding electrode 52-2.

Referring to FIG. 3C, in some embodiments, when comparing the enlarged cross-sectional view of the portion EN4 of the semiconductor chip structure 1 of FIG. 3C and the enlarged cross-sectional view of the portion EN2 in FIG. 3A, the components are the same except that shapes of a first bonding electrode 72-3 and a second bonding electrode 52-3 are changed.

In some embodiments, the first bonding electrode 72-3 includes a first via electrode 72b-3 and the first barrier metal layer 72a. An upper surface of the first bonding electrode 72-3 has a fourth width W4 in the X direction that is less than the first width W1 of FIG. 3A. The fourth width W4 of the first bonding electrode 72-3 is substantially equal to a width of the first via electrode 72b-3.

In some embodiments, the second bonding electrode 52-3 includes a second via electrode 52b-3 and the second barrier metal layer 52a. An upper surface of the second bonding electrode 52-3 has a fifth width W5 in the X direction that is less than the second width W2 of FIG. 3A. The fifth width W5 of the second bonding electrode 52-3 is substantially equal to a width of the second via electrode 52b-3. The fifth width W5 of the second bonding electrode 52-3 is substantially equal to the fourth width W4 of the first bonding electrode 72-3.

As shown by the arrow of FIG. 3C, in some embodiments, when hybrid bonding the first bonding wiring layer 100d and the second bonding wiring layer 200e, the first bonding electrode 72-3 of the first semiconductor chip 100 and the second bonding electrode 52-3 of the second semiconductor chip 200 are easily bonded in the Z direction, that is, the vertical direction.

Figure 4:
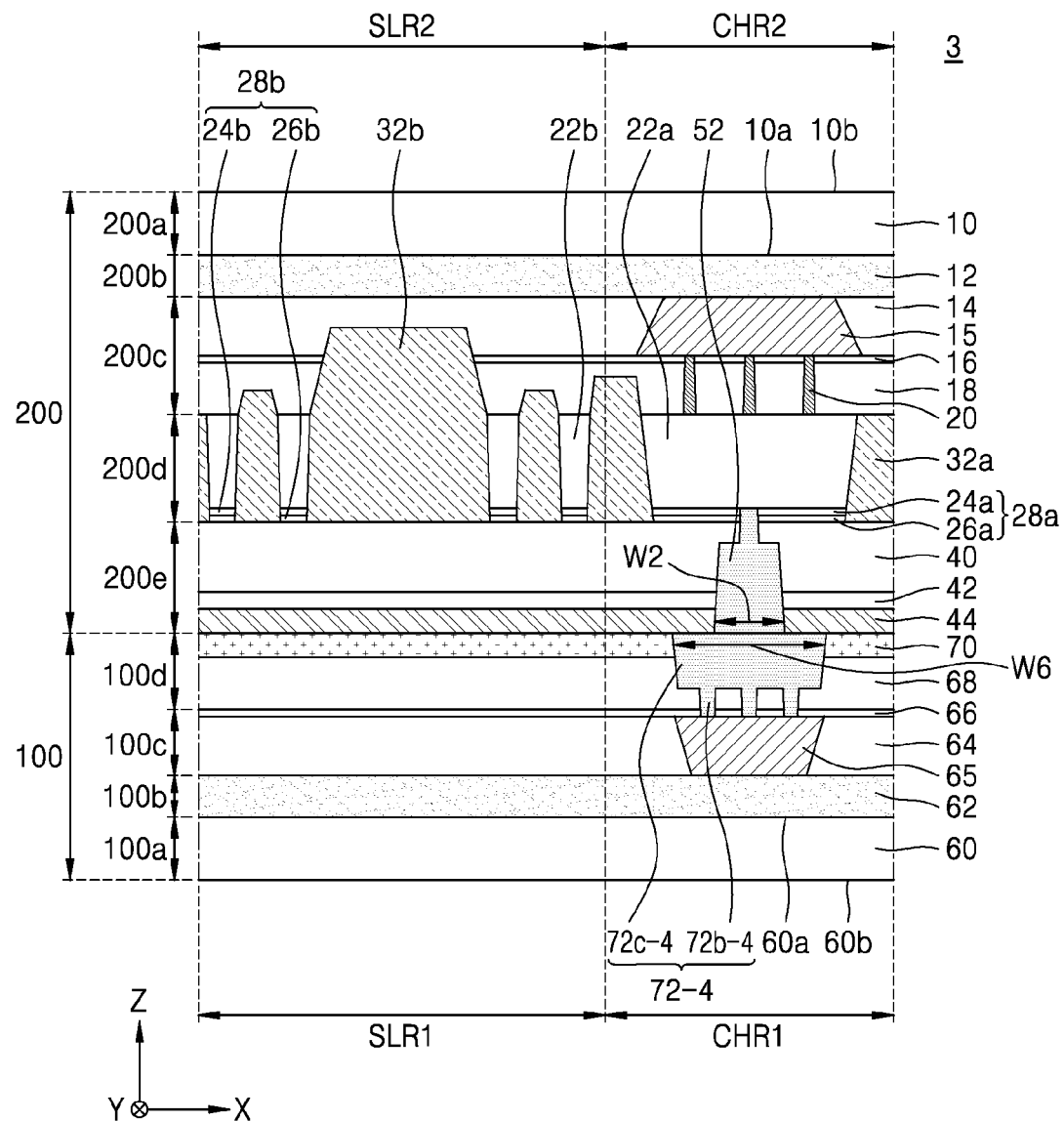
FIG. 4 is a cross-sectional view of a semiconductor chip structure according to an embodiment of the inventive concept.

FIG. 4 is a cross-sectional view of a semiconductor chip structure according to an embodiment of the inventive concept.

Specifically, a semiconductor chip structure 3 of FIG. 4 is substantially the same as a semiconductor chip structure 1 of FIGS. 1 and 2 except that a shape of the first bonding electrode 72-4 is changed. In FIG. 4, the same reference numerals as those in FIGS. 1 and 2 will indicate the same members. In FIG. 4, a description of the same components as those in FIGS. 1 and 2 will be summarized or omitted.

In some embodiments, the semiconductor chip structure 3 includes a first bonding electrode 72-4 in the first bonding wiring layer 100d of the first semiconductor chip 100. The first bonding electrode 72-4 includes a plurality of first via electrodes 72b-4 and a first planar electrode 72c-4. Each of the first via electrodes 72b-4 is electrically connected to the first final wiring pattern 65. An upper portion of the first bonding electrode 72-4 has a sixth width W6 in the X direction that is greater than the first width W1 of FIG. 2.

In some embodiments, the semiconductor chip structure 3 includes the second bonding electrode 52 in the second bonding wiring layer 200e of the second semiconductor chip 200. The second width W2 in the X direction of the second bonding electrode 52 is less than the sixth width W6 of the first bonding electrode 72-4. Accordingly, in the semiconductor chip structure 3, the first bonding electrode 72-4 of the first semiconductor chip 100 is easily bonded to the second bonding electrode 52 of the second semiconductor chip 200.

Figure 5:
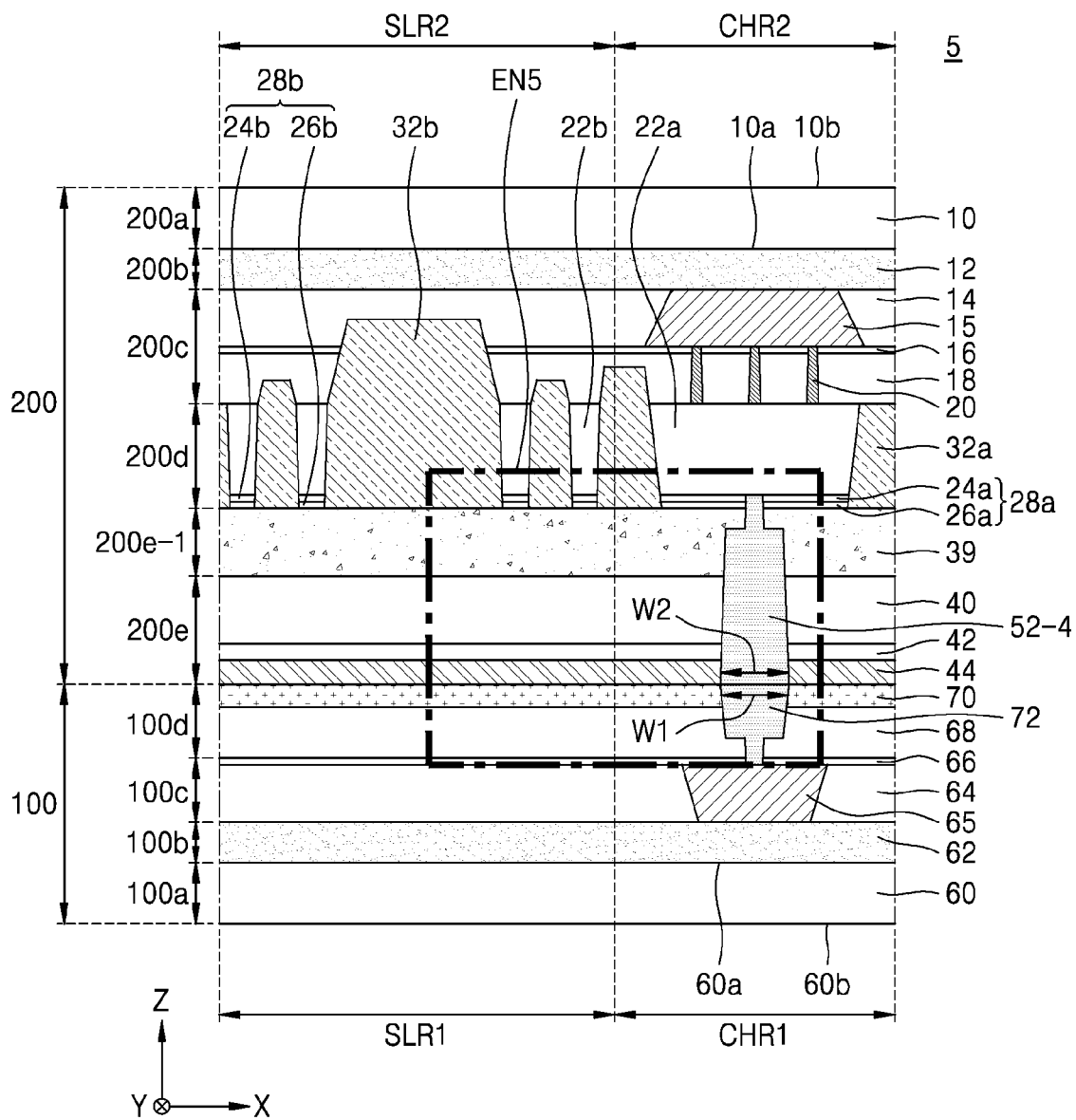
FIG. 5 is a cross-sectional view of a semiconductor chip structure according to an embodiment of the inventive concept.
Figure 6:
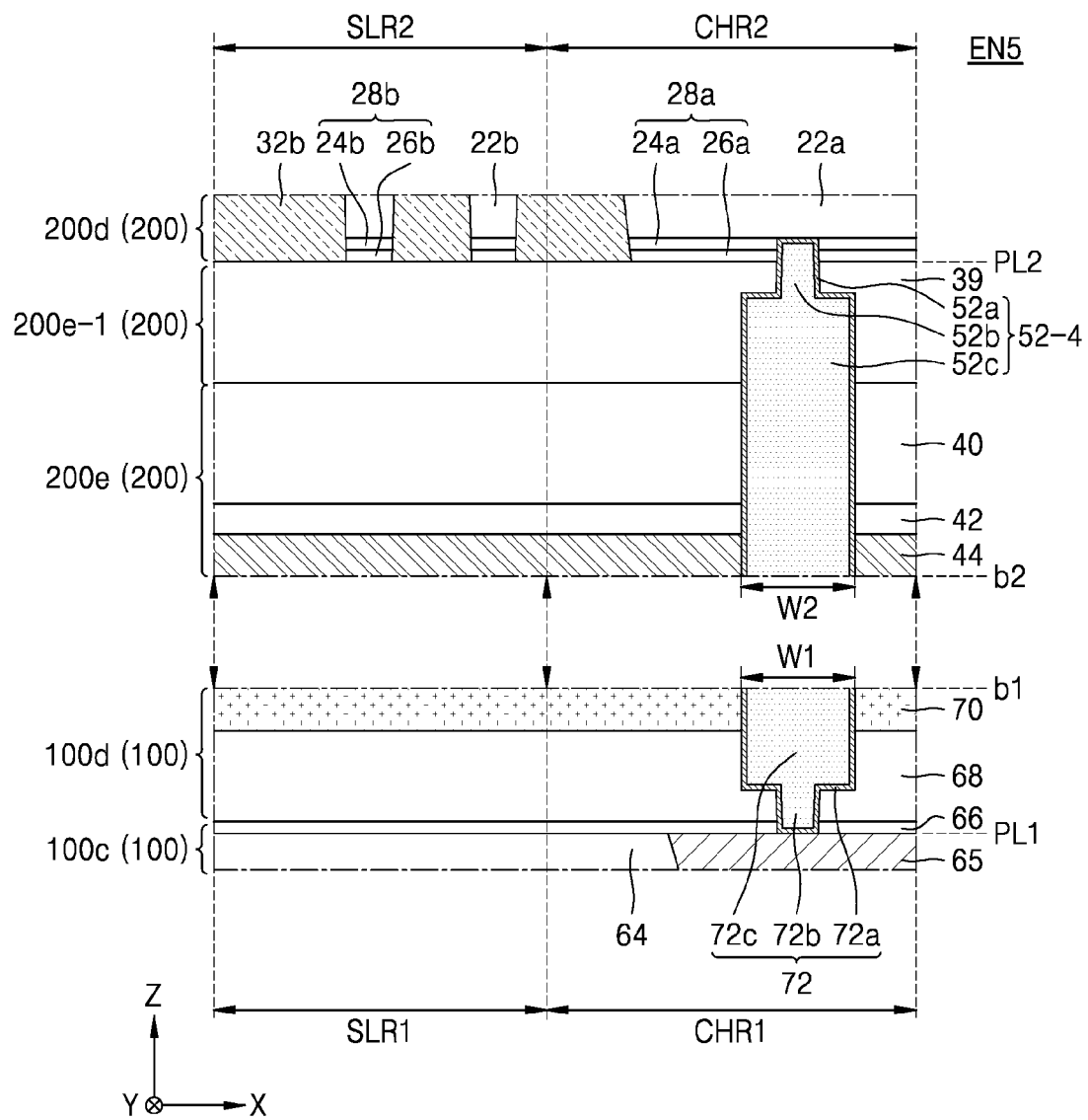
FIG. 6 is a partial cross-sectional view of a semiconductor chip structure of FIG. 5.

FIG. 5 is a cross-sectional view of a semiconductor chip structure according to an embodiment of the inventive concept, and FIG. 6 is a partial cross-sectional view of a semiconductor chip structure of FIG. 5.

Specifically, FIG. 6 is an enlarged cross-sectional view of a portion EN5 of a semiconductor chip structure 5 of FIG. 5. The semiconductor chip structure 5 is substantially the same as the semiconductor chip structure 1 of FIGS. 1 and 2 except that the semiconductor chip structure 5 further includes a reinforcing bonding wiring layer 200e-1 that contains a reinforcing insulating layer 39. In FIGS. 5 and 6, the same reference numerals as those in FIGS. 1 and 2 will indicate the same members. In FIGS. 5 and 6, a description of the same components as those in FIGS. 1 and 2 will be summarized or omitted.

In some embodiments, the first semiconductor chip 100 includes the first bonding wiring layer 100d formed on the first final wiring layer 100c. The first bonding wiring layer 100d includes the first interlayer insulating layer 68, the first bonding insulating layer 70, and the first bonding electrode 72. The first bonding electrode 72 has the first width W1 in the X direction.

In the second semiconductor chip 200, in some embodiments, the reinforcing bonding wiring layer 200e-1 that contains the reinforcing insulating layer 39 is further formed on the second final wiring layer 200d. The reinforcing insulating layer 39 is be formed on the polishing stop patterns 28a and 28b and the second passivation layers 32a and 32b. The reinforcing insulating layer 39 protects or reinforces the second final wiring patterns 22a and 22b, the polishing stop patterns 28a and 28b, the second passivation layers 32a and 32b.

In some embodiments, the reinforcing insulating layer 39 is formed of a different material from that of the second interlayer insulating layer 40. The reinforcing insulating layer 39 includes silicon oxide. The reinforcing insulating layer 39 is formed by an HDP method.

In some embodiments, the second bonding wiring layer 200e is formed on the reinforcing bonding wiring layer 200e-1. The second bonded wiring layer 200e includes the second interlayer insulating layer 40, the adhesive layer 42 formed on the second interlayer insulating layer 40, the second bonding insulating layer 44 formed on the adhesive layer 42, and a second bonding electrode 52-4 formed in the second bonding insulating layer 44, the adhesive layer 42, the second interlayer insulating layer 40, the reinforcing insulating layer 39, and the polishing stop pattern 28a. The second bonding electrode 52-4 has the second width W2 in the X direction. The second width W2 of second bonding electrode 52-4 is substantially equal to the first width W1 of the first bonding electrode 72.

In some embodiments, the first bonding surface b1 of the first bonding wiring layer 100d is hybrid bonded to the second bonding surface b2 of the second bonding wiring layer 200e, as indicated by the arrows of FIG. 6. The first bonding electrode 72 is bonded to the second bonding electrode 52-4. In the semiconductor chip structure 5, the first bonding surface b1 of the first bonding wiring layer 100d is easily bonded to the second bonding surface b2 of the second bonding wiring layer 200e without damage due to the presence of the reinforcing bonding wiring layer 200e-1.

Figure 7:
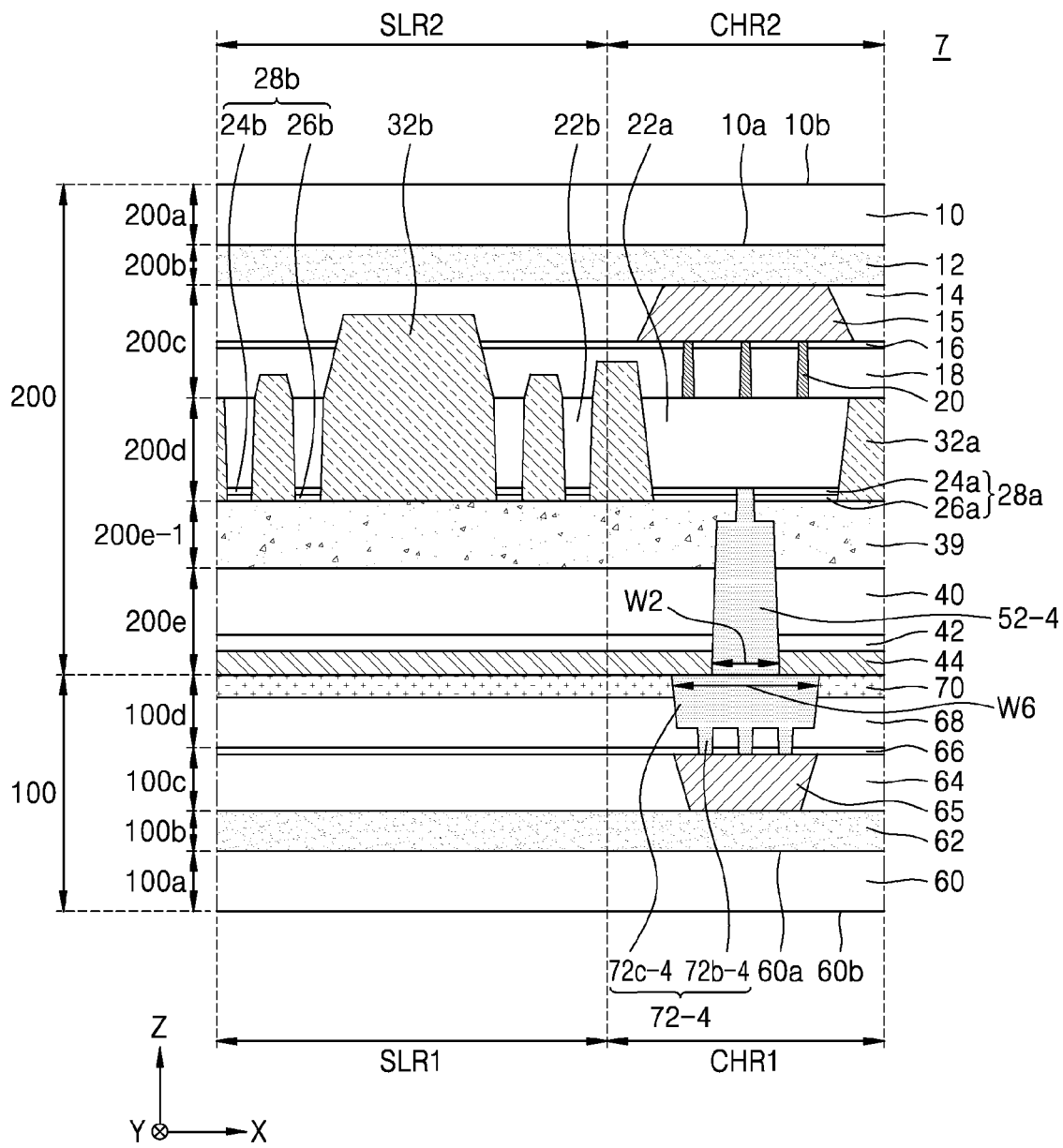
FIG. 7 is a cross-sectional view of a semiconductor chip structure according to an embodiment of the inventive concept.

FIG. 7 is a cross-sectional view of a semiconductor chip structure according to an embodiment of the inventive concept.

Specifically, a semiconductor chip structure 7 is substantially the same as the semiconductor chip structure 5 of FIGS. 5 and 6 except that a shape of the first bonding electrode 72-4 is changed. In FIG. 7, the same reference numerals as those in FIGS. 5 and 6 will indicate the same members. In FIG. 7, a description of the same components as those in FIGS. 5 and 6 will be summarized or omitted.

In some embodiments, the semiconductor chip structure 7 includes a first bonding electrode 72-4 in the first bonding wiring layer 100d of the first semiconductor chip 100. The first bonding electrode 72-4 includes a plurality of first via electrodes 72b-4 and a first planar electrode 72c-4. Each of the first via electrodes 72b-4 is electrically connected to the first final wiring pattern 65. The upper portion of the first bonding electrode 72-4 has a sixth width W6 in the X direction that is greater than the first width W1 of FIG. 2.

In some embodiments, the semiconductor chip structure 7 includes the second bonding electrode 52-4 in the second bonding wiring layer 200e of the second semiconductor chip 200. The second width W2 of the second bonding electrode 52-4 is less than the sixth width W6 of the first bonding electrode 72-4. Accordingly, in the semiconductor chip structure 7, the first bonding electrode 72-4 of the first semiconductor chip 100 is easily bonded to the second bonding electrode 52-4 of the second semiconductor chip 200.

FIGS. 8 to 15 are cross-sectional views that illustrate a method of manufacturing the semiconductor chip structure of FIGS. 1 and 2.

Specifically, FIGS. 8 to 14 illustrate a method of manufacturing the second semiconductor chip 200 of FIGS. 1 and 2. In FIGS. 8 to 14, the same reference numerals as those in FIGS. 1 and 2 will indicate the same members.

Figure 8:
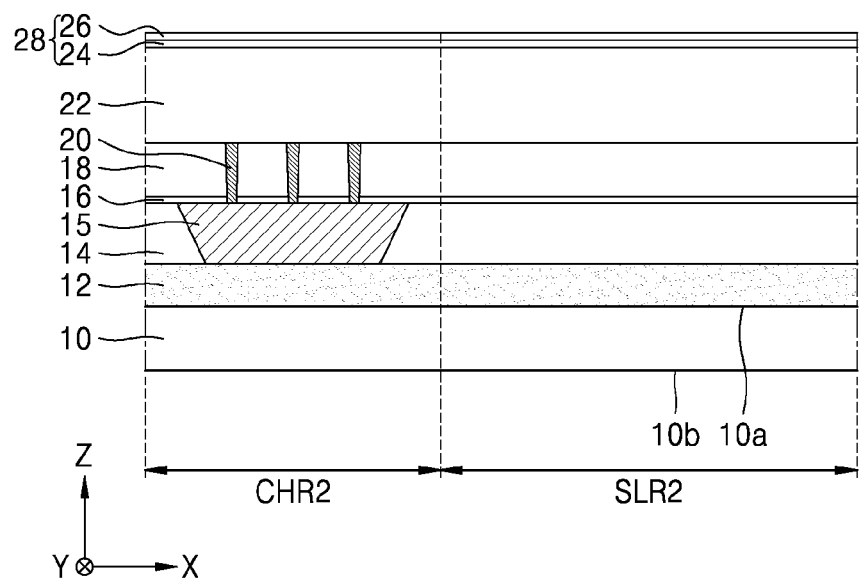
FIGS. 8 to 15 are cross-sectional views that illustrate a method of manufacturing a semiconductor chip structure of FIGS. 1 and 2.

Referring to FIG. 8, in some embodiments, the second circuit 12 is formed in the second chip region CHR2 and the second scribe lane region SLR2 on the front surface 10*a* of the second substrate 10. The second substrate 10 has the front surface 10*a* and the back surface 10*b* opposite to the surface 10*a*. The second circuit 12 includes a memory cell as described above. The memory cell includes a circuit element, such as the transistor.

In some embodiments, the intermediate wiring pattern 15 is formed on the second circuit 12. The first intermediate wiring insulating layer 14 includes silicon oxide and insulates the intermediate wiring pattern 15. The first intermediate wiring insulating layer 14 is formed by an HDP method. The intermediate wiring pattern 15 is electrically connected to the second circuit 12. The intermediate wiring pattern 15 includes a metal, such as aluminum, copper, or tungsten, etc.

In some embodiments, the second etch stop 16 is formed on the first intermediate wiring insulating layer 14 and the intermediate wiring pattern 15. The second etch stop layer 16 includes silicon nitride. The intermediate wiring via 20 and the second intermediate wiring insulating layer 18 are formed on the second etch stop layer 16, and the intermediate wiring via 20 is electrically connected to the intermediate wiring pattern 15 and the intermediate wiring via 20 is insulated by the second intermediate wiring insulating layer 18.

In some embodiments, the intermediate wiring via 20 includes a metal, such as aluminum, copper, or tungsten, etc. The second intermediate wiring insulating layer 18 includes silicon oxide. The second intermediate wiring insulating layer 18 is formed by an HDP method.

In some embodiments, the second final wiring material layer 22 and the polishing stop material layer 28 are sequentially formed on the second intermediate wiring insulating layer 18 and the intermediate wiring via 20. The second final wiring material layer 22 includes a metal. The second final wiring material layer 22 includes at least one of aluminum, copper, or tungsten, etc.

In some embodiments, the second final wiring pattern 22 is a metal alloy that contains a base metal, such as aluminum, and an impurity element, such as silicon. The polishing stop material layer 28 includes a combination of a metal layer 24 and an insulating layer 26. The metal layer 24 includes a single layer of Ti, Ta, or TiN, or a combination layer thereof. The insulating layer 26 includes silicon nitride.

Figure 9:
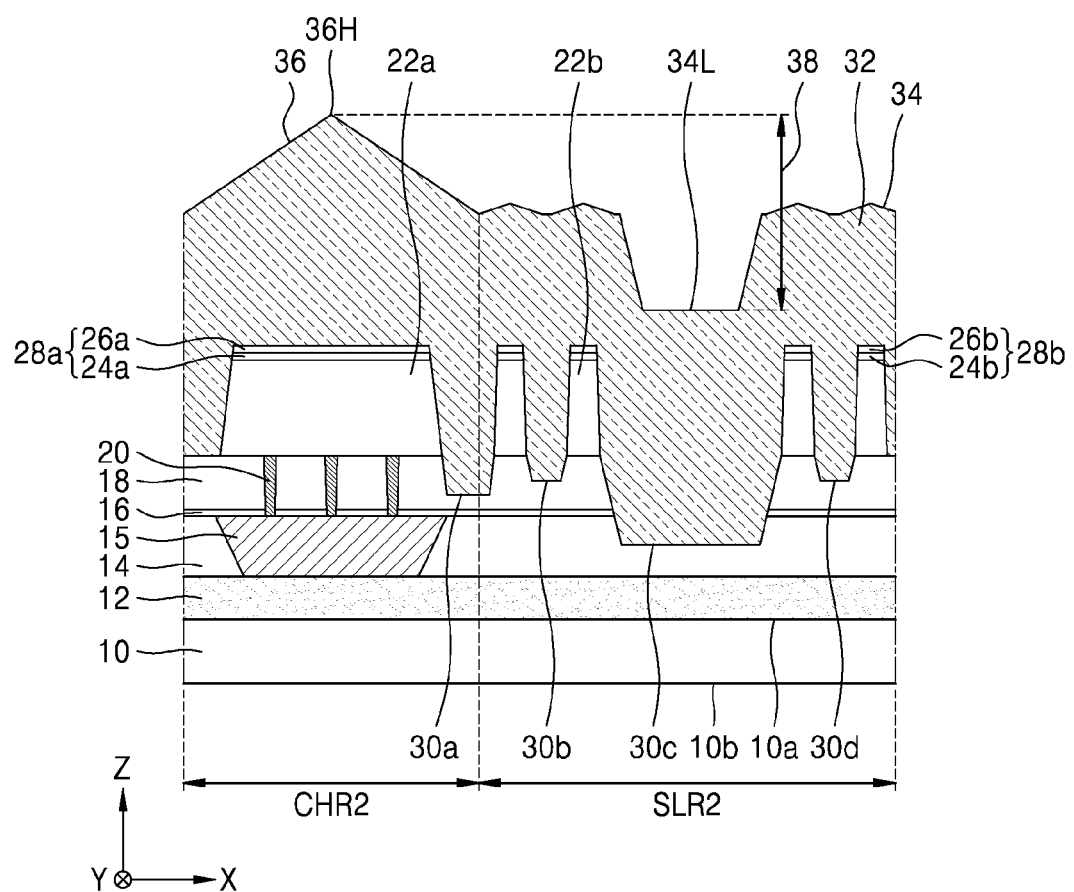

Referring to FIG. 9, in some embodiments, the polishing stop material layer 28 and the second final wiring material layer 22 are patterned through a photolithography process to form the polishing stop patterns 28*a* and 28*b* and the second final wiring patterns 22*a* and 22*b*.

In some embodiments, the second final wiring patterns 22*a* and 22*b* include the second final wiring pattern 22*a* formed in the second chip region CHR2 and the second final wiring pattern 22*b* formed in the second scribe lane region SLR2. The width of the second final wiring pattern 22*a* in the X direction is greater than the width of the second final wiring pattern 22*b*. The second final wiring pattern 22*b* is more dense than the second final wiring pattern 22*a*.

In some embodiments, the polishing stop patterns 28*a* and 28*b* are formed on the second final wiring patterns 22*a* and 22*b*. The polishing stop patterns 28*a* and 28*b* include a combination of metal patterns 24*a* and 24*b* and insulating patterns 26*a* and 26*b*. The polishing stop patterns 28*a* and 28*b* include the polishing stop pattern 28*a* formed in the second chip region CHR2 and the polishing stop pattern 28*b* formed in the second scribe lane region SLR2. A width in the X direction of the polishing stop pattern 28*a* is greater than a width of the polishing stop pattern 28*b*.

In some embodiments, first to fourth trenches 30*a*, 30*b*, 30*c*, and 30*d* are formed in the second intermediate wiring insulating layer 18 due to over-etching when forming the second final wiring patterns 22*a* and 22*b* and the polishing stop patterns 28*a* and 28*b*. The third trench 30*c* formed in the second scribe lane region SLR2 is wider in the X direction than the first, second, and fourth trenches 30*a*, 30*b*, and 30*d*. The third trench 30*c* has a depth in the Z direction that is greater than that of the first, second, and fourth trenches 30*a*, 30*b*, and 30*d*.

Subsequently, in some embodiments, a second passivation material layer 32 is formed on the second final wiring patterns 22*an* and 22*b* and the polishing stop patterns 28*a* and 28*b* while filling the first to fourth trenches 30*a*, 30*b*, 30*c*, and 30*d*. The second passivation material layer 32 includes silicon oxide. The second passivation material layer 32 is formed by an HDP method.

In some embodiments, the second passivation material layer 32 has an first upper surface 36 and a second upper surface 34, respectively, in the second chip region CHR2 and the second scribe lane region SLR2. The second passivation material layer 32 has a step 38 between an uppermost surface 36H of the second chip area CHR2 and a lowermost surface 34L of the second scribe lane region SLR2.

Figure 10:
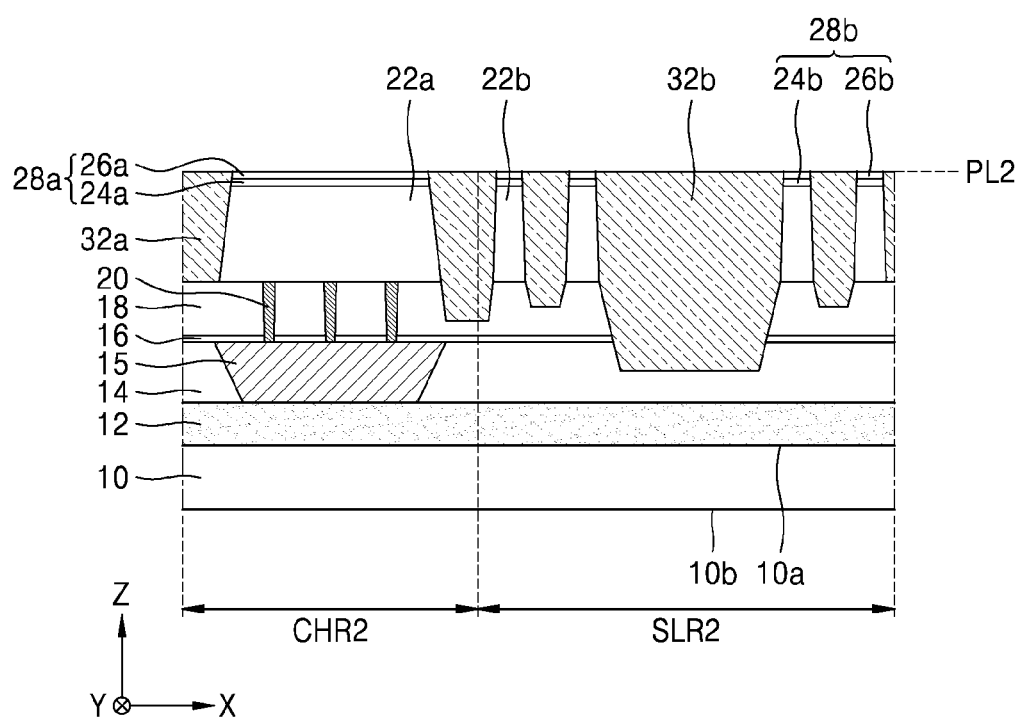

Referring to FIG. 10, the second passivation material layer 32 is polished using the polishing stop patterns 28*a* and 28*b* as a polishing stop layer, for example, through a chemical mechanical polishing process. As a result, the second passivation layers 32*a* and 32*b* are formed between structures that include the second final wiring patterns 22*a* and 22*b* and the polishing stop patterns 28*a* and 28*b*.

In some embodiments, the second passivation layers 32*a* and 32*b* include the passivation layer 32*a* formed in the second chip region CHR2 and the passivation layer 32*b* formed in the second scribe lane region SLR2. The upper surfaces of the polishing stop patterns 28*a* and 28*b* and the second passivation layers 32*a* and 32*b* form the second flat surface PL2, which has no step difference between the second chip region CHR2 and the second scribe lane region SLR2.

Figure 11:
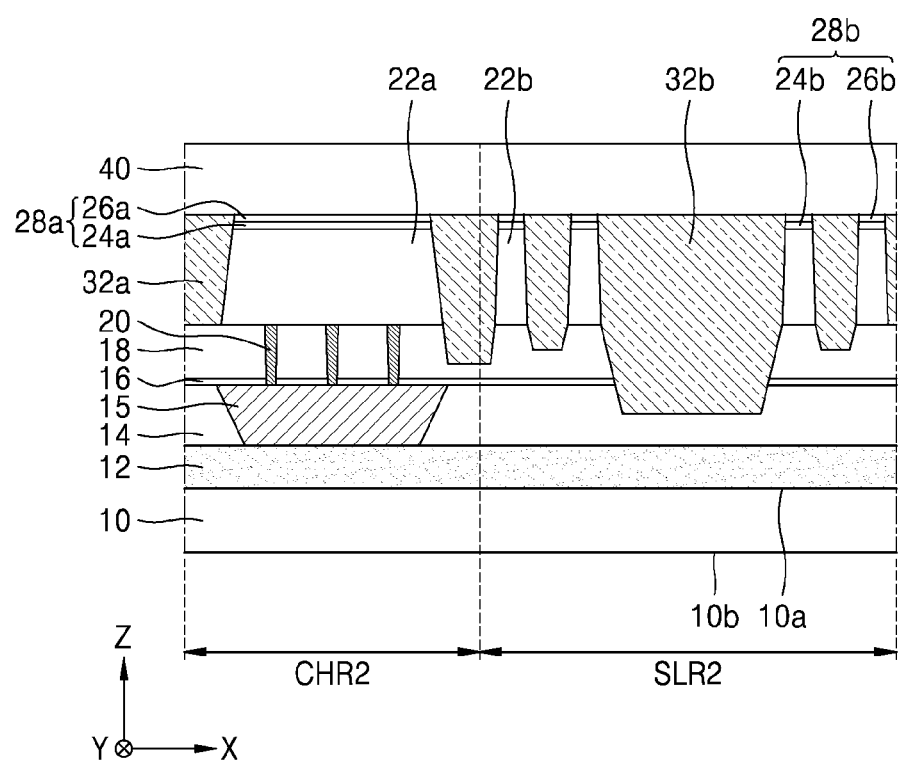
Figure 12:
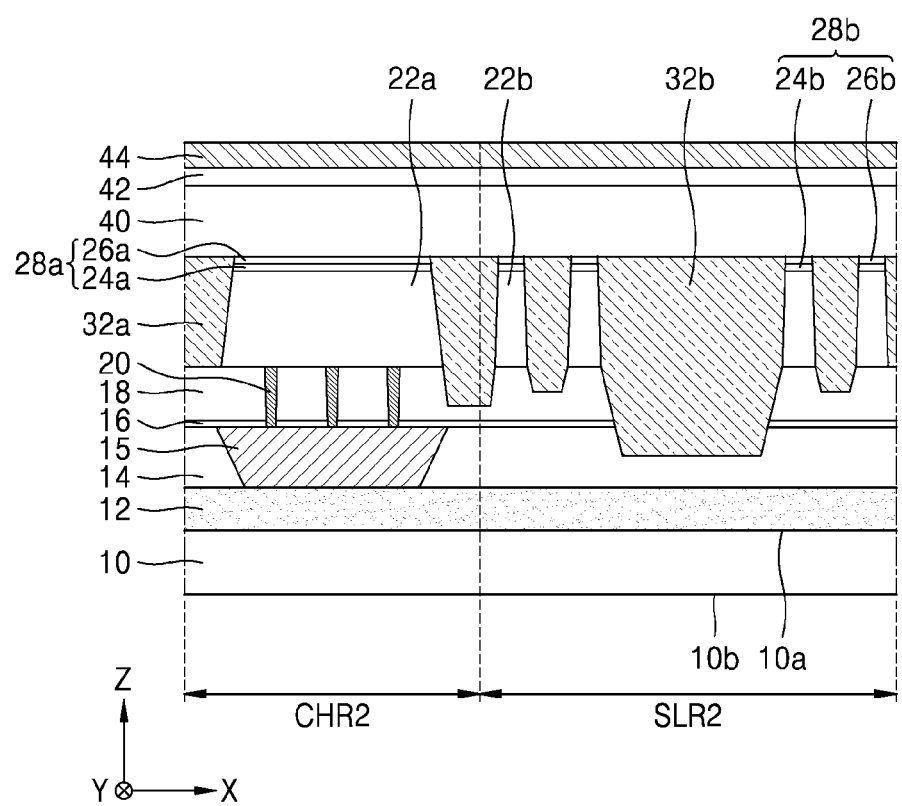

Referring to FIGS. 11 and 12, as shown in FIG. 11, in some embodiments, the second interlayer insulating layer 40 is formed on the polishing stop patterns 28*a* and 28*b* and the second passivation layers 32*a* and 32*b*. The second interlayer insulating layer 40 includes silicon nitride. Then, the resulting structure is heat treated to from the second final wiring patterns 22*a* and 22*b*, the polishing stop patterns 28*a* and 28*b*, the second passivation layers 32*a* and 32*b*, and the second interlayer insulating layer 40. Through the heat treatment process, the second final wiring patterns 22*a* and 22*b* and the polishing stop patterns 28*a* and 28*b* are alloyed.

Subsequently, as shown in FIG. 12, in some embodiments, the adhesive layer 42 and the second bonding insulating layer 44 are sequentially formed on the second interlayer insulating layer 40. The adhesive layer 42 improves the adhesion between the second interlayer insulating layer 40 and the second bonding insulating layer 44.

The adhesive layer 42 includes silicon oxide. The second bonding insulating layer 44 includes at least one of a silicon carbon nitride (SiCN) film, a silicon oxycarbonitride (SiOCN) film, a silicon boron nitride (SiBN) film, a silicon oxide (SiO) film, or a boron nitride (BN) film.

Figure 13:
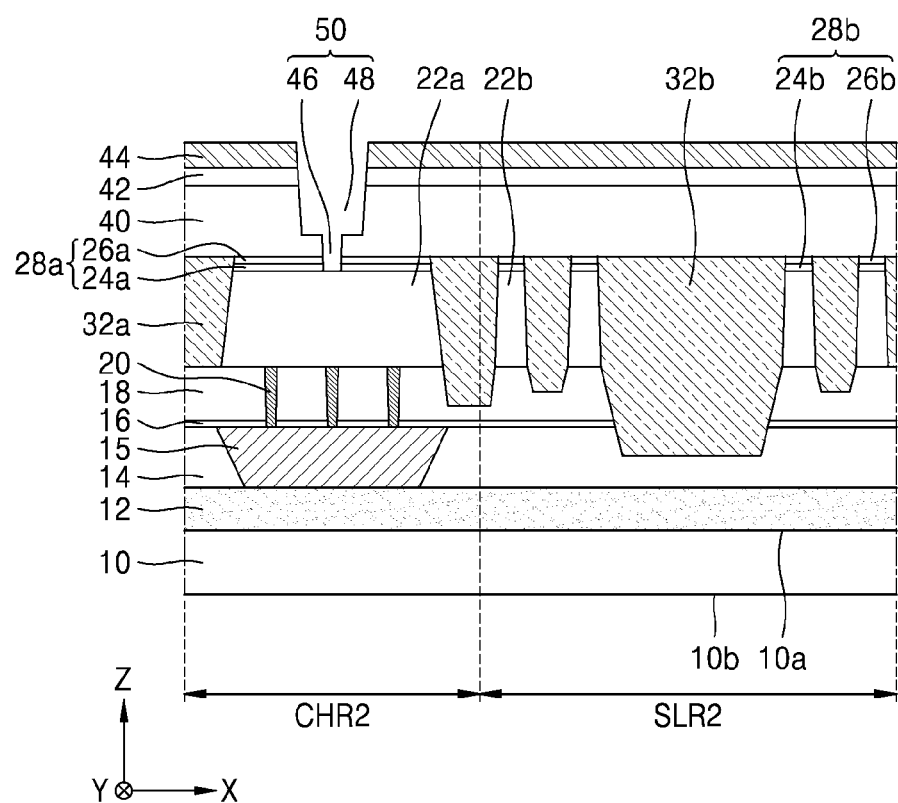

Referring to FIG. 13, in some embodiments, the second bonding insulating layer 44, the adhesive layer 42, the second interlayer insulating layer 40, and the polishing stop pattern 28a are patterned through a photolithograph process to form the second via hole 50. The second via hole 50 is formed in the second bonding insulating layer 44, the adhesive layer 42, the second interlayer insulating layer 40, and the polishing stop pattern 28a. The second via hole 50 exposes a surface of the second final wiring pattern 22a in the second chip region CHR2.

In some embodiments, the second via hole 50 includes a second lower via hole 46 formed in the second interlayer insulating layer 40 and the polishing stop pattern 28a, and a second upper via hole 48 formed in the second bonding insulating layer 44, the adhesive layer 42, and the interlayer insulating layer 40. The second upper via hole 48 is wider in the X direction than the second lower via hole 46. The second upper via hole 48 is connected with the second lower via hole 46.

Figure 14:
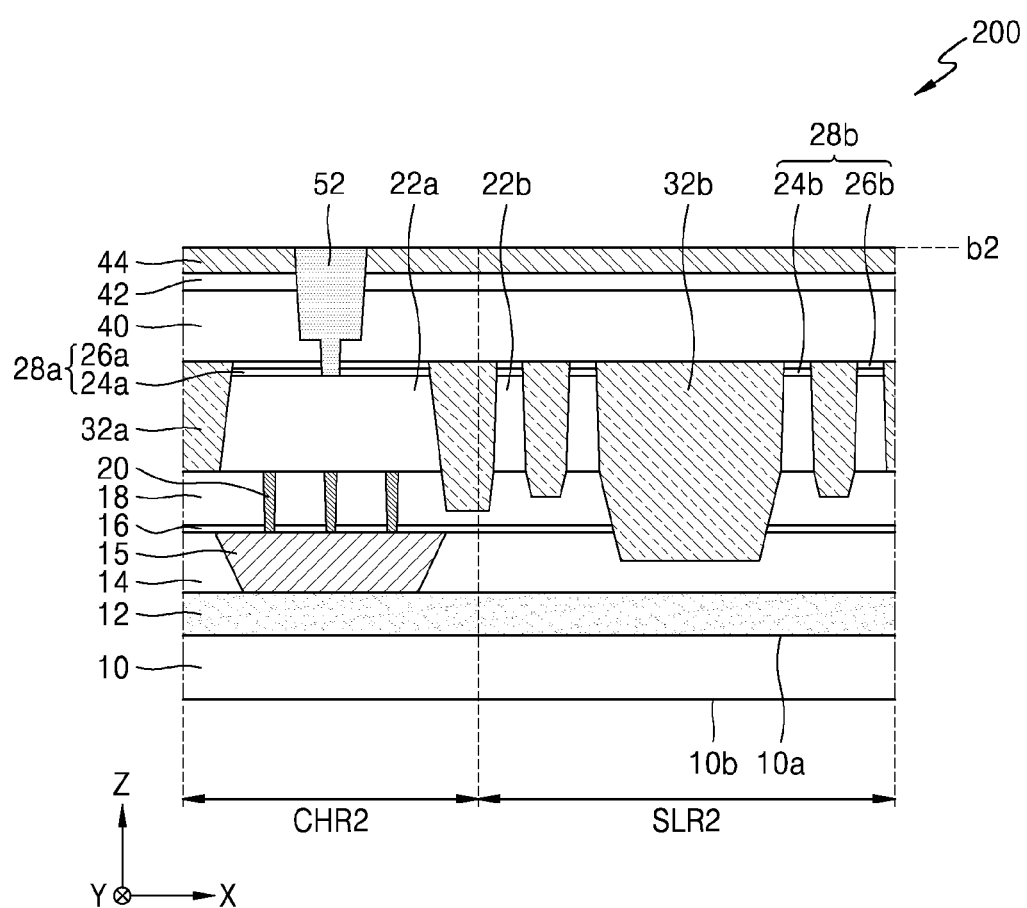

Referring to FIG. 14, in some embodiments, the second bonding electrode 52 is formed in the second via hole 50. The second bonding electrode 52 includes a metal, such as copper. The second bonding electrode 52 is formed by forming a second bonding electrode material layer on the second bonding insulating layer 44 while filling the second via hole 50, and then polishing the second bonding electrode material layer through a polishing process, such as a chemical mechanical polishing process.

In some embodiments, the upper surfaces of the second bonding electrode 52 and the second bonding insulating layer 44 form the second bonding surface b2, which has no step difference between the second chip region CHR2 and the second scribe lane region SLR2. The second bonding surface b2 is a second flat bonding surface. Through such a manufacturing process, the second semiconductor chip 200 of FIGS. 1 and 2 can be manufactured.

Figure 15:
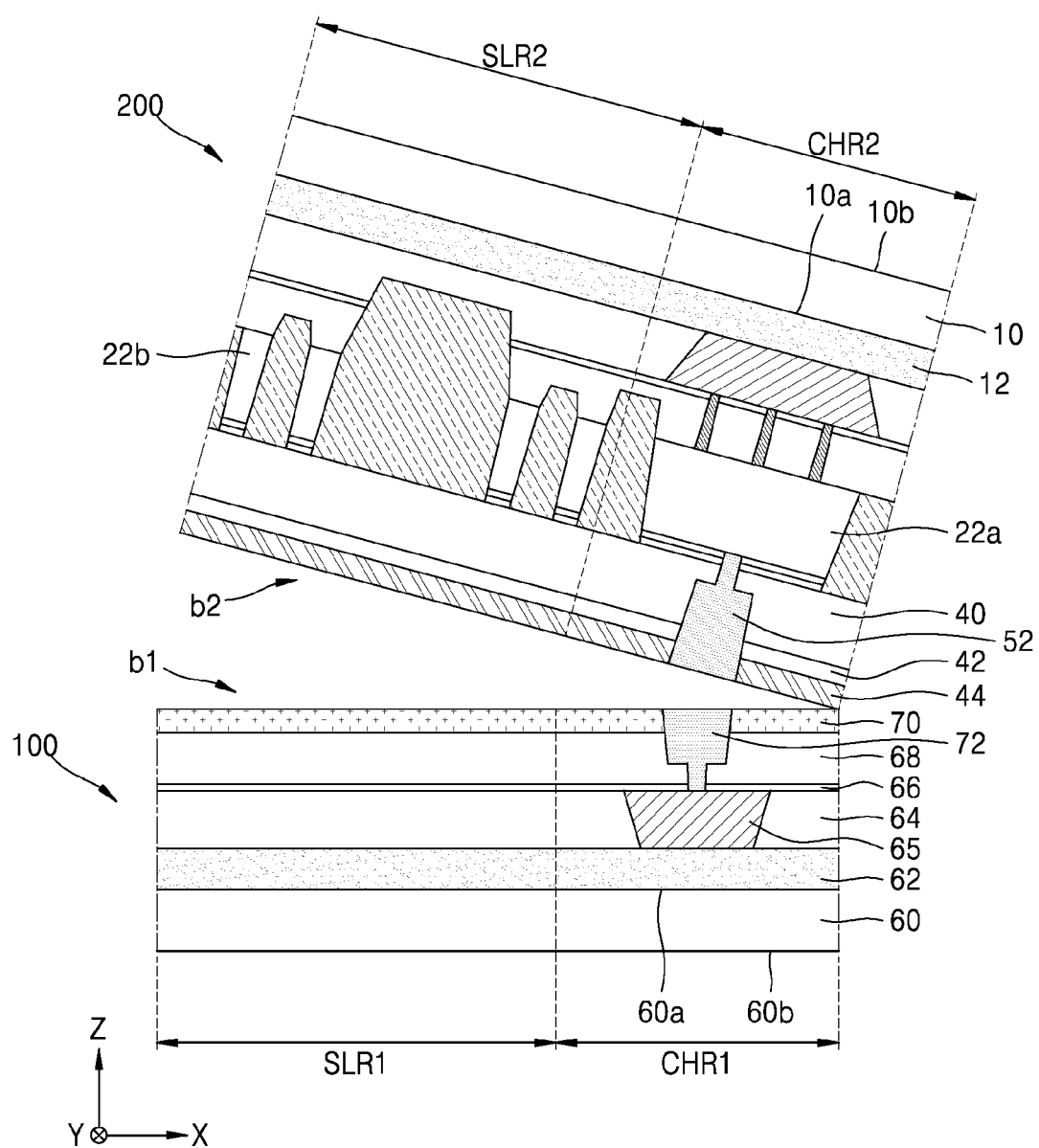

FIG. 15 illustrates a bonding process of the first semiconductor chip 100 and the second semiconductor chip 200 of FIGS. 1 and 2. The first semiconductor chip 100 as shown in FIGS. 1 and 2 is prepared. In FIG. 15, the same reference numerals as those in FIGS. 1 and 2 will indicate the same members. In FIG. 15, a description of the same components as those in FIGS. 1 and 2 will be summarized or omitted.

In some embodiments, the formation of the first semiconductor chip 100 includes forming the first circuit 62 on the first substrate 60, and then forming of the first passivation layer 64 and the first final wiring pattern 65 on the first circuit 62. Then, the first etch stop layer 66 is formed on the first passivation layer 64 and the first final wiring pattern 65. Then, the first interlayer insulating layer 68 and the first bonding insulating layer 70 are formed on the first etch stop layer 66.

Then, in some embodiments, the first bonding electrode 72 is formed in the first interlayer insulating layer 68 and the first bonding insulating layer 70 on the first etch stop layer 66, and is electrically connected to the first final wiring pattern 65. The first bonding insulating layer 70 includes at least one of a silicon carbon nitride (SiCN) film, a silicon oxycarbonitride (SiOCN) film, a silicon boron nitride (SiBN) film, a silicon oxide (SiO) film, or a boron nitride (BN) film. The first bonding electrode 72 includes a metal, such as copper.

In some embodiments, the upper surfaces of the first bonding electrode 72 and the first bonding insulating layer 70 form the first bonding surface b1, which has no step difference between the first chip region CHR1 and the first scribe lane region SLR1. The first bonding surface b1 is a first flat bonding surface. Through such a manufacturing process, the first semiconductor chip 100 can be manufactured.

As shown in FIG. 15, in some embodiments, the second semiconductor chip 200 previously prepared is then turned on and positioned above the first semiconductor chip 100. Then, the first bonding electrode 52 and the second bonding insulating layer 44, which have the second bonding surface b2, is hybrid bonded to respectively match the first bonding electrode 72 and the first bonding insulating layer 70, which have the first bonding surface b1. The first bonding surface b1 and the second bonding surface b2 are flat bonding surfaces, and thus the first and second bonding surfaces b1 and b2 can be easily bonded together.

FIGS. 16 to 21 are cross-sectional views that illustrate a method of manufacturing a semiconductor chip structure of FIGS. 5 and 6.

Specifically, FIGS. 16 to 20 illustrate a method of manufacturing the second semiconductor chip 200 of FIGS. 5 and 6. In FIGS. 16 to 20, the same reference numerals as those in FIGS. 5 and 6 will indicate the same members.

Figure 16:
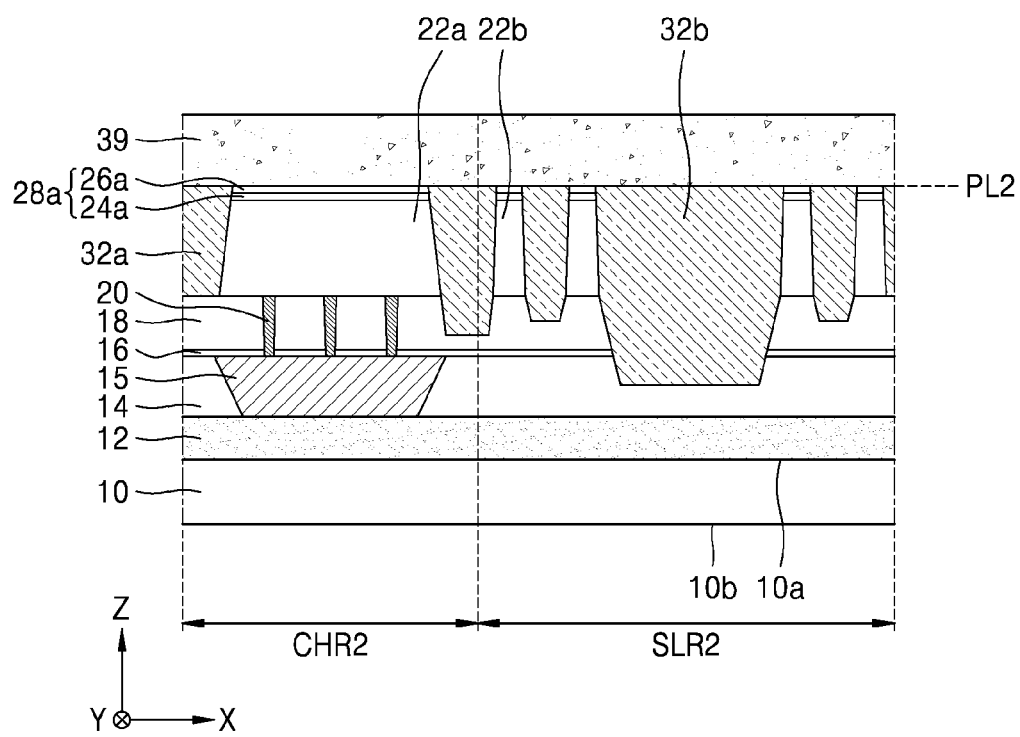
FIGS. 16 to 21 are cross-sectional views that illustrate a method of manufacturing a semiconductor chip structure of FIGS. 5 and 6.

Referring to FIG. 16, in some embodiments, a manufacturing process as previously described with reference to FIGS. 8 to 10 is performed. Thus, the second final wiring patterns 22a and 22b, the polishing stop patterns 28a and 28b, and the second passivation layers 32a and 32b are formed in the second chip region CHR2 and the second scribe lane region SLR2 on an upper portion of the second substrate 10.

In addition, in some embodiments, the upper surfaces of the polishing stop patterns 28a and 28b and the second passivation layers 32a and 32b form the second flat surface PL2, which has no step difference between the second chip region CHR2 and the second scribe lane region SLR2.

Subsequently, in some embodiments, the reinforcing insulating layer 39 is formed on the second final wiring patterns 22a and 22b, the polishing stop patterns 28a and 28b, and the second passivation layers 32a and 32b. The reinforcing insulating layer 39 protects or reinforces the second final wiring patterns 22a and 22b, the polishing stop patterns 28a and 28b, the second passivation layers 32a and 32b.

In some embodiments, the reinforcing insulating layer 39 includes a different material from that of the second interlayer insulating layer 40. The reinforcing insulating layer 39 includes silicon oxide. The reinforcing insulating layer 39 is formed by an HDP method.

Figure 17:
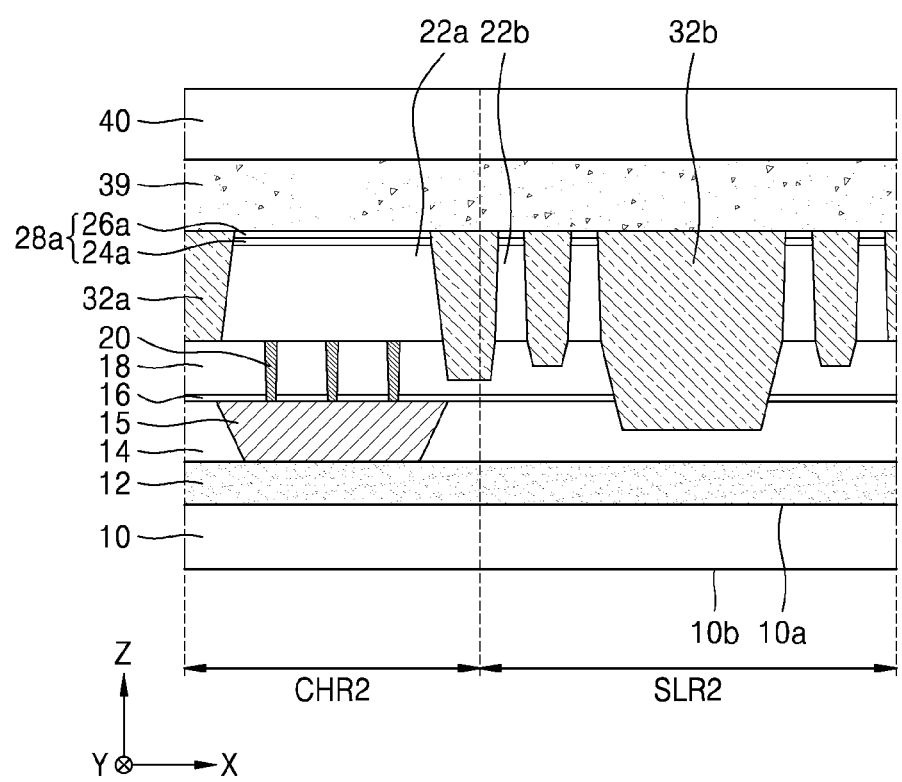
Figure 18:
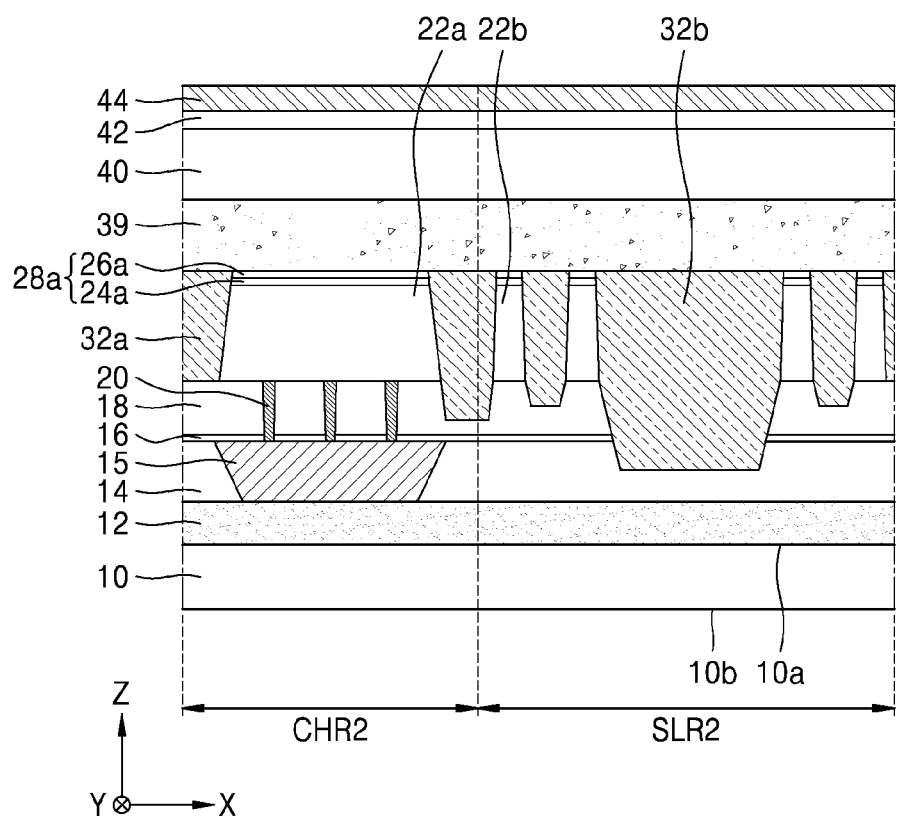

Referring to FIGS. 17 and 18, the second interlayer insulating layer 40 is formed on the reinforcing insulating layer 39, as shown in FIG. 17. The second interlayer insulating layer 40 includes silicon nitride. The second interlayer insulating layer 40 includes a different material from that of the reinforcing insulating layer 39.

Then, in some embodiments, the resulting structure is heat treated to from the second final wiring patterns 22a and 22b, the polishing stop patterns 28a and 28b, the second passivation layers 32a and 32b, the reinforcing insulating layer 39, and the second interlayer insulating layer 40. Through the heat treatment process, the second final wiring patterns 22a and 22b and the polishing stop patterns 28a and 28b are alloyed.

Subsequently, in some embodiments, as shown in FIG. 18, the adhesive layer 42 and the second bonding insulating layer 44 are sequentially formed on the second interlayer insulating layer 40. The adhesive layer 42 improves the adhesion between the second interlayer insulating layer 40 and the second bonding insulating layer 44. The adhesive layer 42 includes silicon oxide. The second bonding insulating layer 44 includes at least one of a silicon carbon nitride (SiCN) film, a silicon oxycarbonitride (SiOCN) film, a silicon boron nitride (SiBN) film, or a boron nitride (BN) film.

Figure 19:
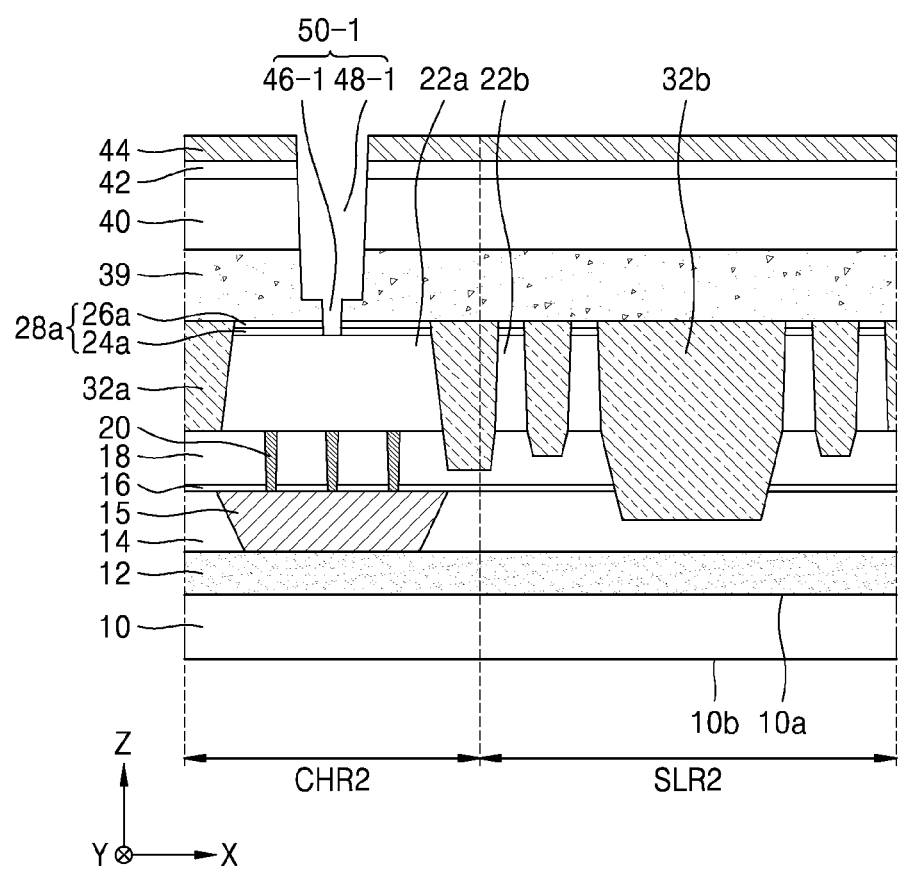

Referring to FIG. 19, in some embodiments, the second bonding insulating layer 44, the adhesive layer 42, the second interlayer insulating layer 40, the reinforcing insulating layer 39, and the polishing stop pattern 28a are patterned through a photolithograph process to form the second via hole 50-1. The second via hole 50-1 is formed in the second bonding insulating layer 44, the adhesive layer 42, the second interlayer insulating layer 40, the reinforcing insulating layer 39, and the polishing stop pattern 28a. The second via hole 50-1 exposes the surface of the second final wiring pattern 22a in the second chip region CHR2.

In some embodiments, the second via hole 50-1 includes a second lower via hole 46-1 formed in the reinforcing insulating layer 39 and the polishing stop pattern 28a, and a second upper via hole 48-1 formed in the second bonding insulating layer 44, the adhesive layer 42, the interlayer insulating layer 40, and the reinforcing insulating layer 39. The second upper via hole 48-1 is wider in the X direction than the second lower via hole 46-1. The second upper via hole 48-1 is connected to the second lower via hole 46-1.

Figure 20:
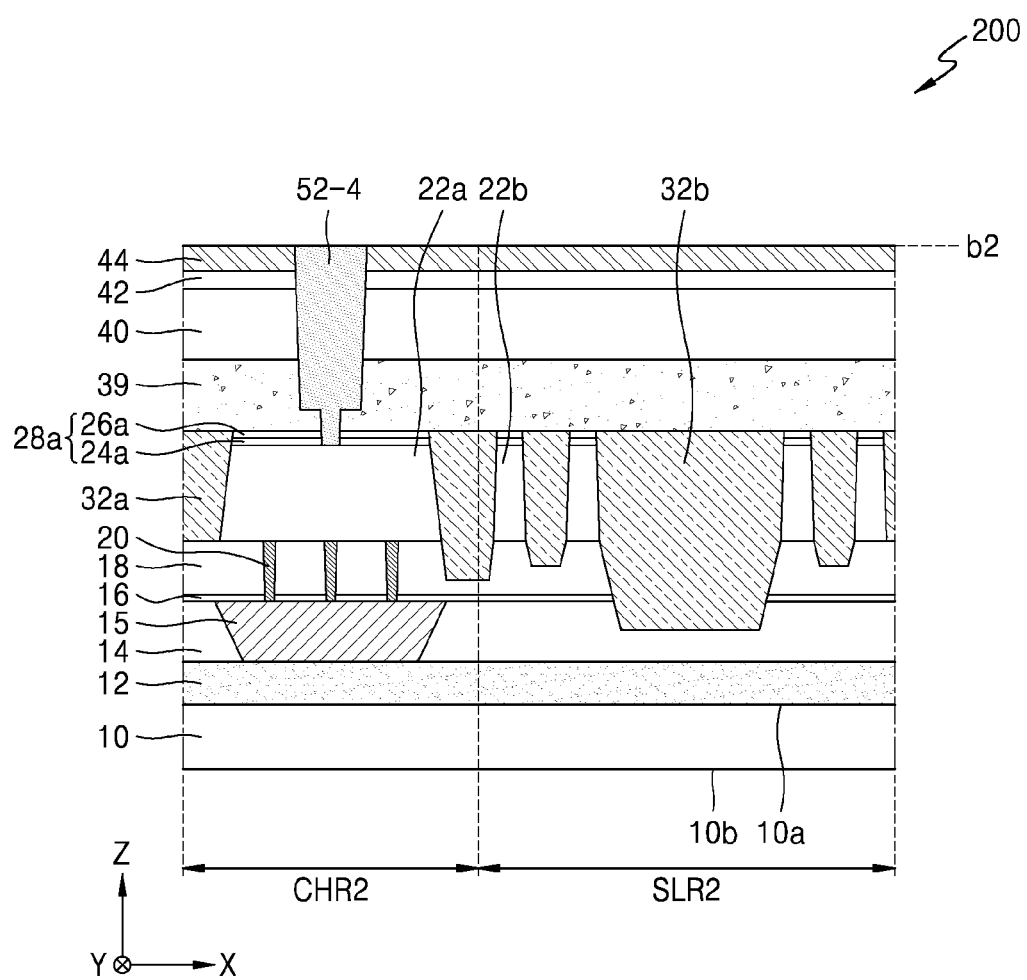

Referring to FIG. 20, in some embodiments, the second bonding electrode 52-4 is formed in the second via hole 50-1. The second bonding electrode 52-4 includes a metal, such as copper. The second bonding electrode 52-4 is formed by forming a second bonding electrode material layer on the second bonding insulating layer 44 while filling the second via hole 50-1, and then polishing the second bonding electrode material layer through a polishing process, such as a chemical mechanical polishing process.

In some embodiments, the upper surfaces of the second bonding electrode 52-4 and the second bonding insulating layer 44 form the second bonding surface b2, which has no step difference between the second chip region CHR2 and the second scribe lane region SLR2. The second bonding surface b2 is a second flat bonding surface. The second bonding electrodes 52-4 described with reference to FIGS. 19 and 20 can be formed by a dual damascene process. Through such a manufacturing process, the second semiconductor chip 200 of FIGS. 5 and 6 can be manufactured.

Figure 21:
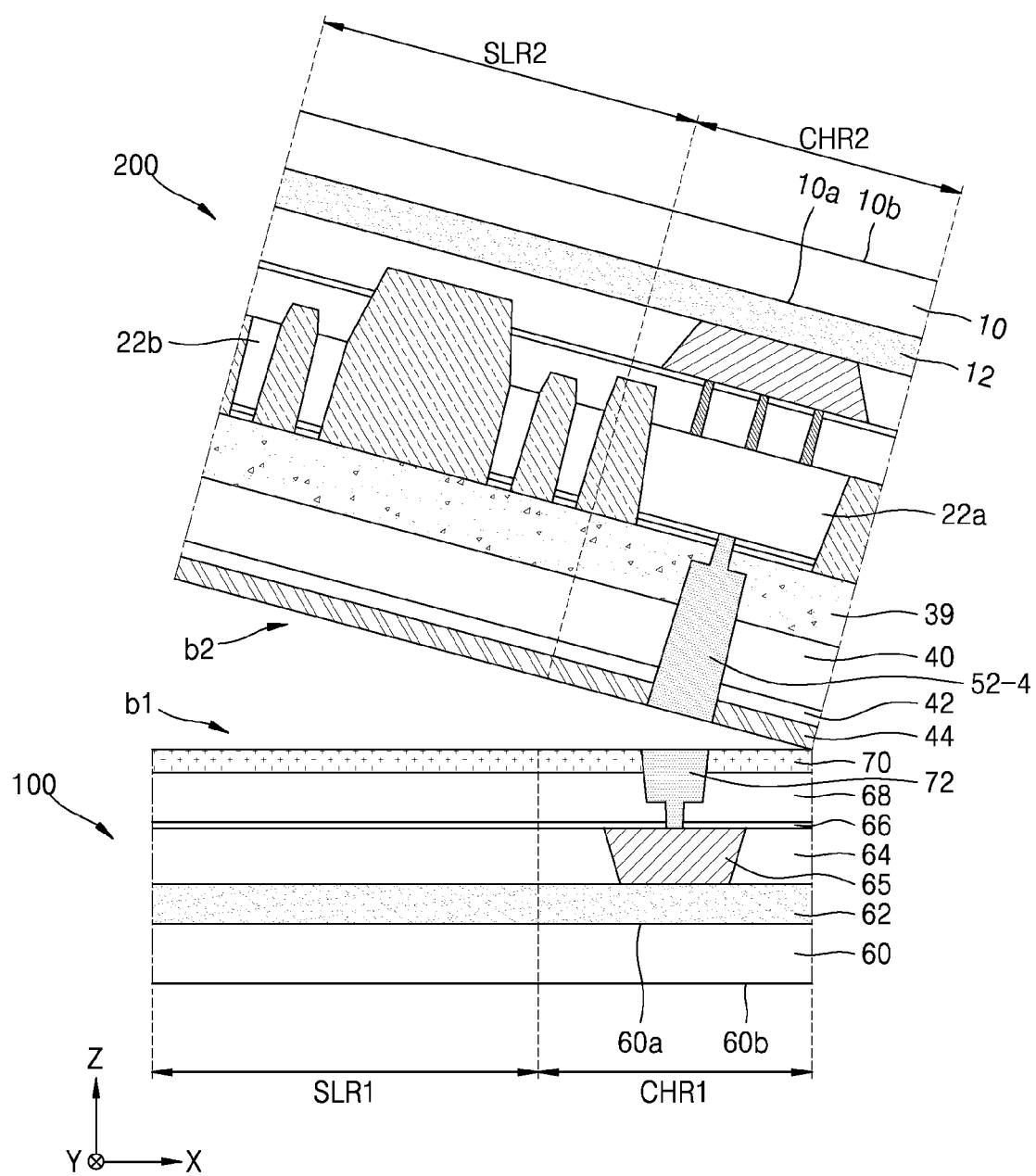

FIG. 21 illustrates a bonding process of the first semiconductor chip 100 and the second semiconductor chip 200 of FIGS. 5 and 6. The first semiconductor chip 100 as shown in FIGS. 5 and 6 is prepared. In FIG. 21, the same reference numerals as those in FIGS. 5 and 6 will indicate the same members. In FIG. 21, a description of the same components as those in FIGS. 5 and 6 will be summarized or omitted.

In a same manner as described above with reference to FIG. 15, in some embodiments, the first semiconductor chip 100 is prepared. In the first semiconductor chip 100, the first bonding insulating layer 70 and the first bonding electrode 72 are formed in the first chip region CHR1 and the first scribe lane region SLR1 on the upper portion of the first substrate 60. The upper surfaces of the first bonding electrode 72 and the first bonding insulating layer 70 form the first bonding surface b1, which has no step difference between the first chip region CHR1 and the first scribe lane region SLR1. The first bonding surface b1 is a first flat bonding surface.

As shown in FIG. 21, in some embodiments, the second semiconductor chip 200 previously prepared is then turned on and positioned above the first semiconductor chip 100. Then, the first bonding electrode 52 and the second bonding insulating layer 44, which have the second bonding surface b2, is hybrid bonded to respectively match the first bonding electrode 72 and the first bonding insulating layer 70, which has the first bonding surface b1. The first bonding surface b1 and the second bonding surface b2 are flat bonding surfaces, and thus the first and second bonding surfaces b1 and b2 can be easily bonded together.

Figure 22:
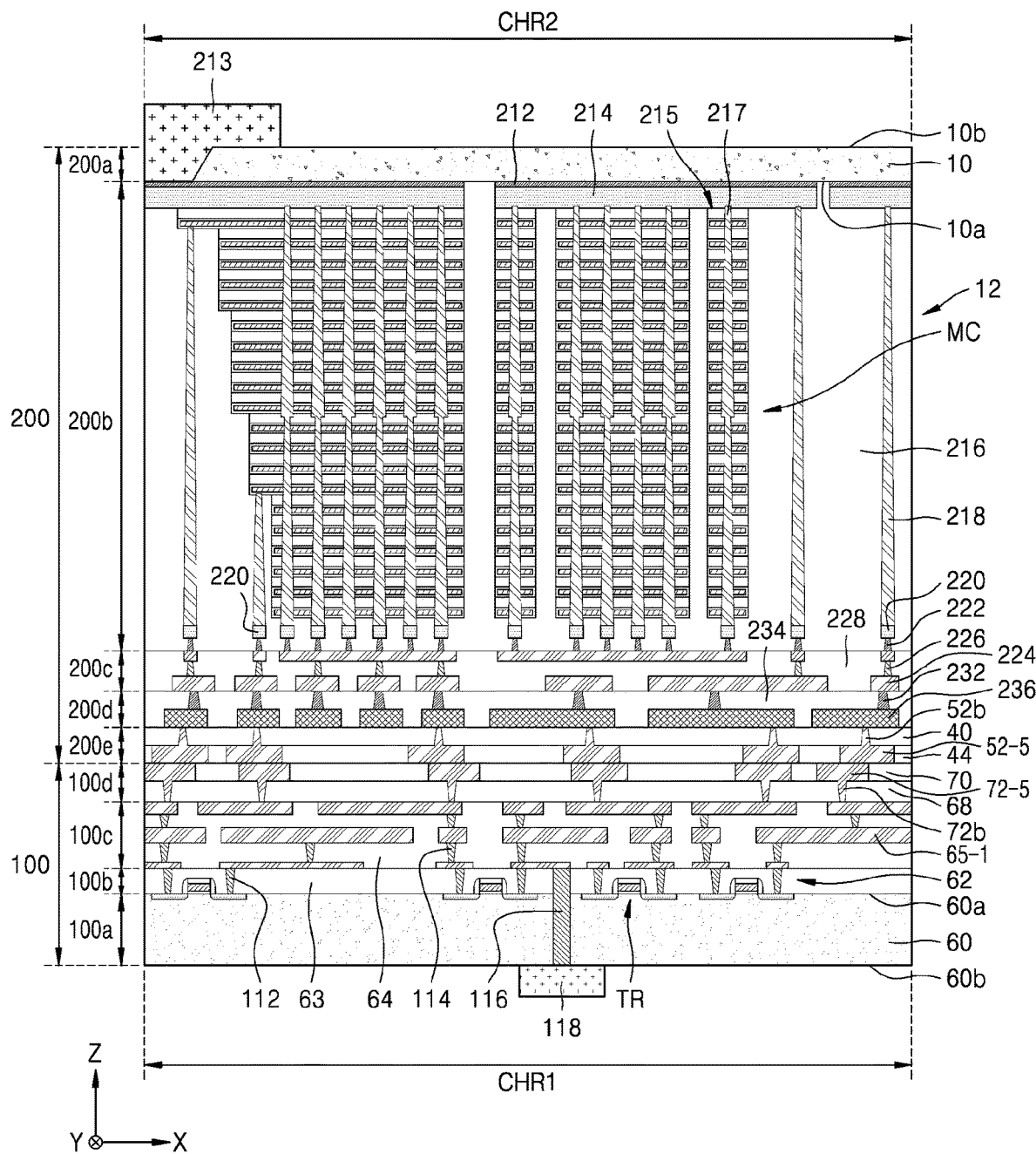
FIG. 22 is a cross-sectional view of a semiconductor chip structure according to an embodiment of the inventive concept.

FIG. 22 is a cross-sectional view of a semiconductor chip structure according to an embodiment of the inventive concept.

Specifically, in FIG. 22, in some embodiments, the X direction and the Y direction are horizontal to the surface 60a of the first substrate 60 and the surface 10a of the second substrate 10. The Z direction is perpendicular to the surface 60a of the first substrate 60 and the surface 10a of the second substrate 10, i.e., a plane defined by the X direction and the Y direction.

In some embodiments, a semiconductor chip structure 9 is constructed by bonding the second semiconductor chip 200 to the first semiconductor chip 100. The first semiconductor chip 100 includes the first chip region CHR1. The first chip region CHR1 is where circuit elements that constitute the first semiconductor chip 100, such as a transistor, are formed. The first chip region CHR1 is where a peripheral circuit is formed.

In some embodiments, the second semiconductor chip 200 includes the second chip region CHR2. The second chip region CHR2 is where circuit elements that constitute the second semiconductor chip 200, such as a memory cell, are formed. The second chip region CHR2 is where the memory cell is formed. In some embodiments, the second chip region CHR2 is where a vertical memory cell, such as a vertical NAND (VNAND) memory cell, is formed.

In some embodiments, the semiconductor chip structure 9 is constructed by bonding the second semiconductor chip 200 to the first semiconductor chip 100. Unlike FIG. 1, for convenience of illustration, FIG. 22 does not show the first scribe lane region SLR1 of the first semiconductor chip 100 or the second scribe lane region SLR2 of the second semiconductor chip 200, and these regions will not be described.

First, components of the first semiconductor chip 100 and the second semiconductor chip 200 will be described in more detail.

More specifically, in some embodiments, the first semiconductor chip 100 includes a first substrate layer 100a, a first circuit layer 100b, a first final wiring layer 100c, and a first bonding wiring layer 100d. The first substrate layer 100a includes the first substrate 60.

In some embodiments, the first substrate 60 includes the front surface 60a and the back surface 60b located opposite to the front surface 60a. The first substrate 60 is a silicon substrate. The first substrate 60 includes a silicon wafer. The first substrate 60 includes the first chip region CHR1.

In some embodiments, the first circuit layer 100b is located on the first substrate layer 100a. The first circuit layer 100b is formed on the first substrate 60. The first circuit layer 100b includes the first circuit 62 and a first circuit insulating layer 63 that insulates the first circuit 62. The first circuit 62 is positioned on the front surface 60a of the first substrate 60. The first circuit 62 is a peripheral circuit. The peripheral circuit includes a transistor TR and a contact plug 112.

In some embodiments, the first final wiring layer 100c is formed on the first circuit layer 100b. The first final wiring layer 100c includes a first final wiring pattern 65-1, a first final wiring via 114, and the first passivation layer 64 that insulates the first final wiring pattern 65-1.

In some embodiments, the first final wiring pattern 65-1 is electrically connected to the first circuit 62. FIG. 22 shows that the first final wiring pattern 65-1 is directly connected to the first circuit 62, but in other embodiments, the first final wiring pattern 65-1 is connected to the first circuit 62 with an intermediate wiring pattern therebetween. The first final wiring pattern 65-1 includes a metal.

In some embodiments, the first final wiring pattern 65-1 is electrically connected to a first external connection terminal 118 located in the back surface 60b of the substrate 60. The first final wiring pattern 65-1 is electrically connected to the first external connection terminal 118 through a penetrating via 116 that penetrates the first circuit insulating layer 63 and the first substrate 60. The first external connection terminal 118 is not formed if not needed.

In some embodiments, the first final wiring pattern 65-1 includes a different metal from that of a first bonding electrode 72-5. In some embodiments, the first final wiring pattern 65-1 include at least one of aluminum, copper, or tungsten, etc. In some embodiments, the first final wiring pattern 65-1 is a metal alloy that contains a base metal, such as aluminum, and an impurity element, such as silicon.

In some embodiments, the first passivation layer 64 insulates the first final wiring pattern 65-1. The first passivation layer 64 includes silicon oxide. The first passivation layer 64 is formed by an HDP method.

In some embodiments, the first bonding wiring layer 100d is formed on the first final wiring layer 100c. The first bonding wiring layer 100d may include the first interlayer insulating layer 68, the first bonding insulating layer 70, the first bonding electrode 72-5, and the first via electrode 72b. The first interlayer insulating layer 68 is located above the first passivation layer 64 and the first final wiring pattern 65-1. The first interlayer insulating layer 68 includes silicon oxide. The first interlayer insulating layer 68 is formed by an HDP method.

In some embodiments, the first bonding insulating layer 70 is located on the first interlayer insulating layer 68. The first bonding insulating layer 70 includes at least one of a silicon carbon nitride (SiCN) film, a silicon oxycarbonitride (SiOCN) film, a silicon boron nitride (SiBN) film, a silicon oxide (SiO) film, or a boron nitride (BN) film. The first via electrode 72b is formed in the first interlayer insulating layer 68. The first bonding electrode 72-5 is formed in the first bonding insulating layer 70.

In some embodiments, the first via electrode 72b and the first bonding electrode 72-5 include a metal, such as copper. The first via electrode 72b and the first bonding electrode 72-5 are formed through a damascene process. In an embodiment, the first via electrode 72b and the first bonding electrode 72-5 are integrally formed. In an embodiment, the first via electrode 72b and the first bonding electrode 72-5 are formed through a dual damascene process. Alternatively, as needed, the first via electrode 72b and the first bonding electrode 72-5 can be formed through a single damascene process.

In some embodiments, the second semiconductor chip 200 include the second substrate layer 200a, the second circuit layer 200b, the intermediate wiring layer 200c, the second final wiring layer 200d, and the second bonding wiring layer 200e. The second substrate layer 200a includes the second substrate 10. The second substrate 10 includes the front surface 10a and the back surface 10b located opposite to the front surface 10a. The second substrate 10 is a silicon substrate. The second substrate 10 includes a silicon wafer. The second substrate 10 includes the second chip region CHR2.

In some embodiments, the second circuit layer 200b is formed on the second substrate 10. The second circuit layer 200b includes the second circuit 12. The second circuit 12 is positioned on the front surface 10a of the second substrate 10. The second circuit 12 is driven by the first circuit 62. A second external connection terminal 213 connected to the second circuit 12 is located on the back surface 10b of the second substrate 10. The second external connection terminal 213 is not formed if not needed.

In some embodiments, the second circuit 12 includes a memory cell MC. The memory cell MC includes conductive layers 212 and 214 on the second substrate 10, and a stacked structure 215 and a channel structure 217 disposed on the conductive layers 212 and 214. The second circuit 12 further includes a second circuit insulating layer 216, a contact plug 218, a pad 220, and a via plug 222. The stacked structure 215 and the channel structure 217 that constitute the memory cell MC will be described in more detail below. When the first circuit 62 and the second circuit 12 are separated in the semiconductor chip structure 9, thermal stress applied during the formation of the first circuit 62 and the second circuit 12 can be minimized.

In some embodiments, the intermediate wiring layer 200c is formed on the second circuit layer 200b. The intermediate wiring layer 200C includes an intermediate wiring insulating layer 228, an intermediate wiring pattern 224, and an intermediate wiring via 226. The intermediate wiring pattern 224 is electrically connected to the via plug 222 of the second circuit 12.

In some embodiments, the intermediate wiring pattern 224 and the intermediate wiring via 226 are insulated by the intermediate wiring insulating layer 228. The intermediate wiring pattern 224 and the intermediate wiring via 226 include a metal, such as aluminum, copper, or tungsten, etc. The intermediate wiring insulating layer 228 includes silicon oxide. The intermediate wiring insulating layer 228 is formed by an HDP method.

In some embodiments, the second final wiring layer 200d is formed on the intermediate wiring layer 200c. The second final wiring layer 200d includes a second final wiring pattern 236, a second passivation layer 234, and a second final wiring via 232. The second final wiring pattern 236 is electrically connected to the intermediate wiring pattern 224 via the second final wiring via 232.

In some embodiments, the second final wiring pattern 236 includes a different metal from that of the second bonding electrode 52-5. In some embodiments, the second final wiring pattern 236 includes at least one of aluminum, copper, or tungsten, etc. In some embodiments, the second final wiring pattern 236 is a metal alloy that contains a base metal, such as aluminum, and a impurity element, such as silicon.

In some embodiments, the second passivation layer 234 includes silicon oxide. The second passivation layer 234 is formed by an HDP method.

In some embodiments, the second bonding wiring layer 200e is formed on the second final wiring layer 200d. The second bonded wiring layer 200e includes the second interlayer insulating layer 40, the second via electrode 52b, the second bonding insulating layer 44, and the second bonding electrode 52-5. The second interlayer insulating layer 40 is located on the second passivation layer 234.

In some embodiments, the second interlayer insulating layer 68 includes silicon oxide. The second bonding insulating layer 44 is formed on an upper portion of the second interlayer insulating layer 40. The second bonding insulating layer 44 includes at least one of a silicon carbon nitride (SiCN) film, a silicon oxycarbonitride (SiOCN) film, a silicon boron nitride (SiBN) film, a silicon oxide (SiO) film, or a boron nitride (BN) film.

In some embodiments, the second bonding electrode 52-5 is formed in the second bonding insulating layer 44. The second via electrode 52*b* is formed in the second interlayer insulating layer 40. The second bonding electrode 52-5 and the second via electrode 52*b* include a metal, such as copper. The second bonding electrode 52-5 and the second via electrode 52*b* are formed through a damascene process. In an embodiment, the second via electrode 52*b* and the second bonding electrode 52-5 are integrally formed. In an embodiment, the second bonding electrode 52-5 and the second via electrode 52*b* are formed through a dual damascene process. Alternatively, as needed, the second bonding electrode 52-5 and the second via electrode 52*b* can be formed through a single damascene process.

In some embodiments, the semiconductor chip structure 9 is reliably constructed through a hybrid bonding of the first bonding insulating layer 70 and the first bonding electrode 72-5 in the first bonding wiring layer 100*d* with the second insulating layer 44 and the second bonding electrode 52-5 in the second bonding wiring layer 200*e*, respectively.

FIGS. 23 to 26 are cross-sectional views that illustrate a method of manufacturing a semiconductor chip structure of FIG. 22.

Figure 23:
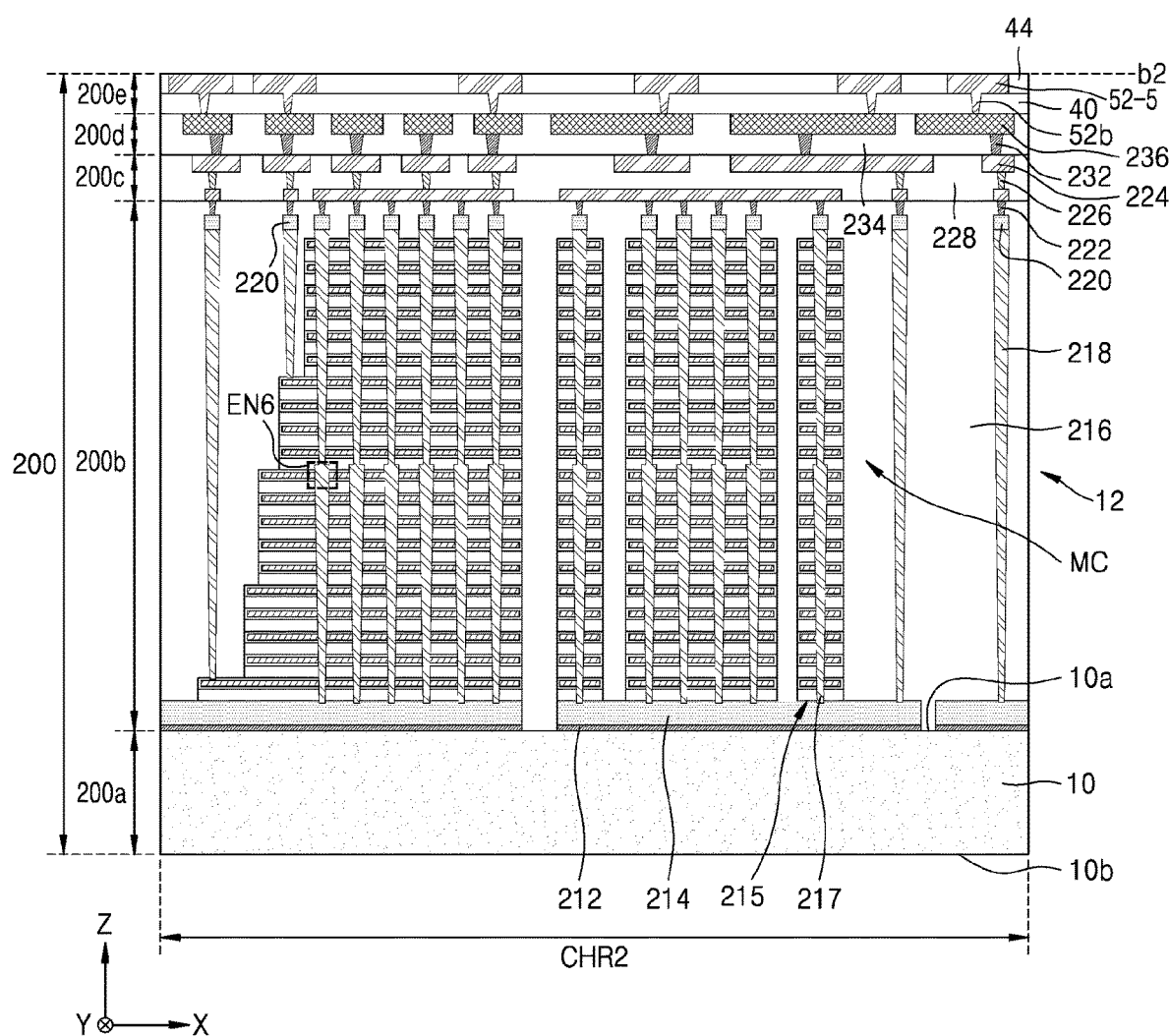
FIGS. 23 to 26 are cross-sectional views that illustrate a method of manufacturing a semiconductor chip structure of FIG. 22.
Figure 24:
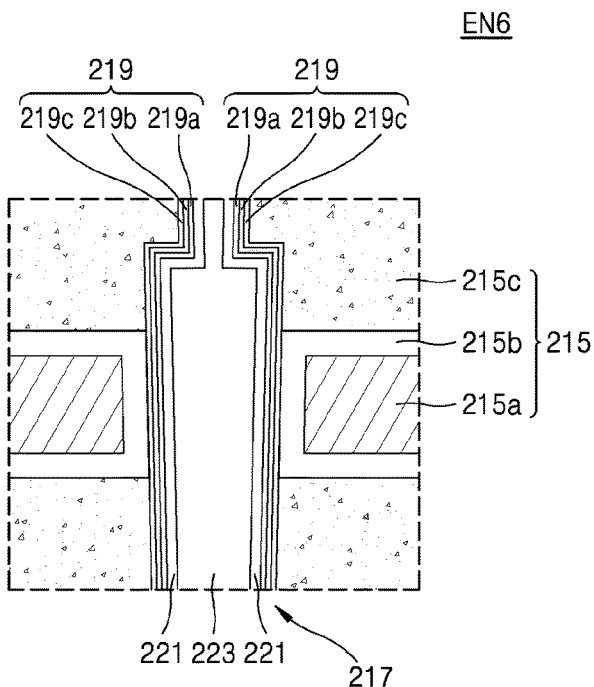

Specifically, FIGS. 23 and 24 illustrate a method of manufacturing the second semiconductor chip 200 of FIG. 22. In FIGS. 23 and 24, the same reference numerals as those in FIG. 22 will indicate the same members. FIG. 24 is an enlarged cross-sectional view of a portion EN6 of FIG. 23.

Referring to FIGS. 23 and 24, in some embodiments, the second semiconductor chip 200 includes the second substrate layer 200*a*. The second substrate layer 200*a* includes the second substrate 10.

In some embodiments, the second circuit layer 200*b* is formed on the second substrate layer 200*a*. The second circuit layer 200*b* includes the second circuit 12. The second circuit 12 is formed on the surface 10*a* of the second substrate 10.

In some embodiments, the second circuit 12 includes the memory cell MC. The memory cell MC includes the conductive layers 212 and 214 of the second substrate 10, and the stacked structure 215 and the channel structure 217 disposed on the conductive layers 212 and 214.

In some embodiments, the stacked structure 215 includes a gate pattern 215*a*, a dielectric layer 215*b*, and an insulating layer 215*c*. The dielectric layer 215*b* covers upper and lower surfaces of the gate pattern 215*a* and extends to some side surfaces. The dielectric layer 215*b* includes a high-k dielectric such as aluminum oxide. The gate pattern 215*a* is stacked while being spaced apart from each other in the vertical direction (the Z direction) by the insulating layer 215*c*.

In some embodiments, the channel structure 217 includes a channel semiconductor layer 221, a vertical insulating layer 223 formed on an inner side of the channel semiconductor layer 221, and a gate dielectric structure 219 disposed between the channel semiconductor layer 221 and the stacked structure 215. The gate dielectric structure 219 includes a tunnel dielectric layer 219*a*, an information storage layer 219*b*, and a blocking dielectric layer 219*c*.

In some embodiments, the tunnel dielectric layer 219*a* includes a silicon oxide and/or an impurity-doped silicon oxide. The blocking dielectric layer 219*c* includes silicon oxide and/or a high dielectric material. The information storage layer 219*b* includes a material that can store information, such as silicon nitride.

In addition, in some embodiments, the second circuit 12 includes the contact plug 218 formed on the conductive layers 212 and 214, the pad 220 formed on the channel structure 217 and the contact plug 218, and the via plug 222 formed on the pad 220. The conductive layers 212 and 214, the contact plug 218, the pad 220, and the via plug 222 are insulated by the second circuit insulating layer 216.

In some embodiments, the intermediate wiring layer 200*c* is formed on the second circuit layer 200*b*. The intermediate wiring layer 200C includes the intermediate wiring insulating layer 228, the intermediate wiring pattern 224, and the intermediate wiring via 226, as described above. The intermediate wiring pattern 224 is electrically connected to the via plug 222 of the second circuit 12.

In some embodiments, the second final wiring layer 200*d* is formed on the intermediate wiring layer 200*c*. As described above, the second final wiring layer 200*d* includes the second final wiring pattern 236, the second passivation layer 234, and the second final wiring via 232. The second final wiring pattern 236 is electrically connected to the intermediate wiring pattern 224 via the second final wiring via 232.

In some embodiments, the second bonding wiring layer 200*e* is formed on the second final wiring layer 200*d*. As described above, the second bonded wiring layer 200*e* includes the second interlayer insulating layer 40, the second via electrode 52*b*, the second bonding insulating layer 44, and the second bonding electrode 52-5.

In some embodiments, the upper surfaces of the second bonding electrode 52-5 and the second bonding insulating layer 44 form the second bonding surface b2. The second bonding surface b2 is a second flat bonding surface. Through such a manufacturing process, the second semiconductor chip 200 of FIG. 22 can be manufactured.

Figure 25:
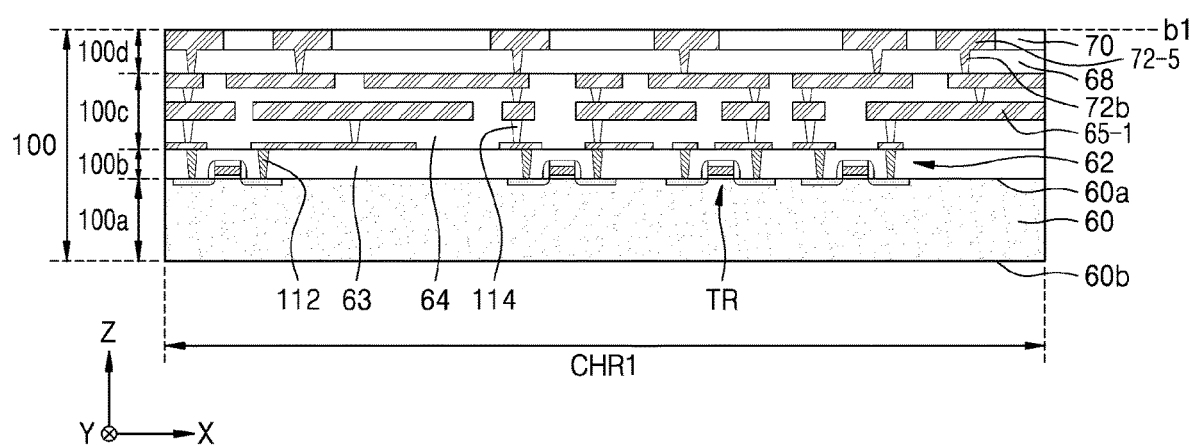

Referring to FIG. 25, in some embodiments, the first semiconductor chip 100 as shown in FIG. 22 is prepared. In FIG. 25, the same reference numerals as those of FIG. 22 will indicate the same members. In FIG. 25, a description of the same components as those in FIGS. 1 and 2 will be summarized or omitted.

In some embodiments, the first semiconductor chip 100 includes the first substrate layer 100*a*. The first substrate layer 100*a* includes the first substrate 60. The first circuit layer 100*b* is formed on the first substrate layer 100*a*. The first circuit layer 100*b* includes the first circuit 62 and the first circuit insulating layer 63 that insulates the first circuit 62. The first circuit 62 is a peripheral circuit. The peripheral circuit includes the transistor TR and the contact plug 112.

In some embodiments, the first final wiring layer 100*c* is formed on the first circuit layer 100*b*. The first final wiring layer 100*c* includes the first passivation layer 64 and the first final wiring pattern 65-1, as described above.

In some embodiments, first bonding wiring layer 100*d* is formed on the first final wiring layer 100*c*. As described above, the first bonding wiring layer 100*d* includes the first interlayer insulating layer 68, the first bonding insulating layer 70, the first bonding electrode 72-5, and the first via electrode 72*b*.

In some embodiments, the upper surfaces of the first bonding electrode 72-5 and the first bonding insulating layer 70 form the first bonding surface b1. The first bonding surface b1 is a first flat bonding surface. Through such a manufacturing process, the first semiconductor chip 100 is manufactured.

Figure 26:
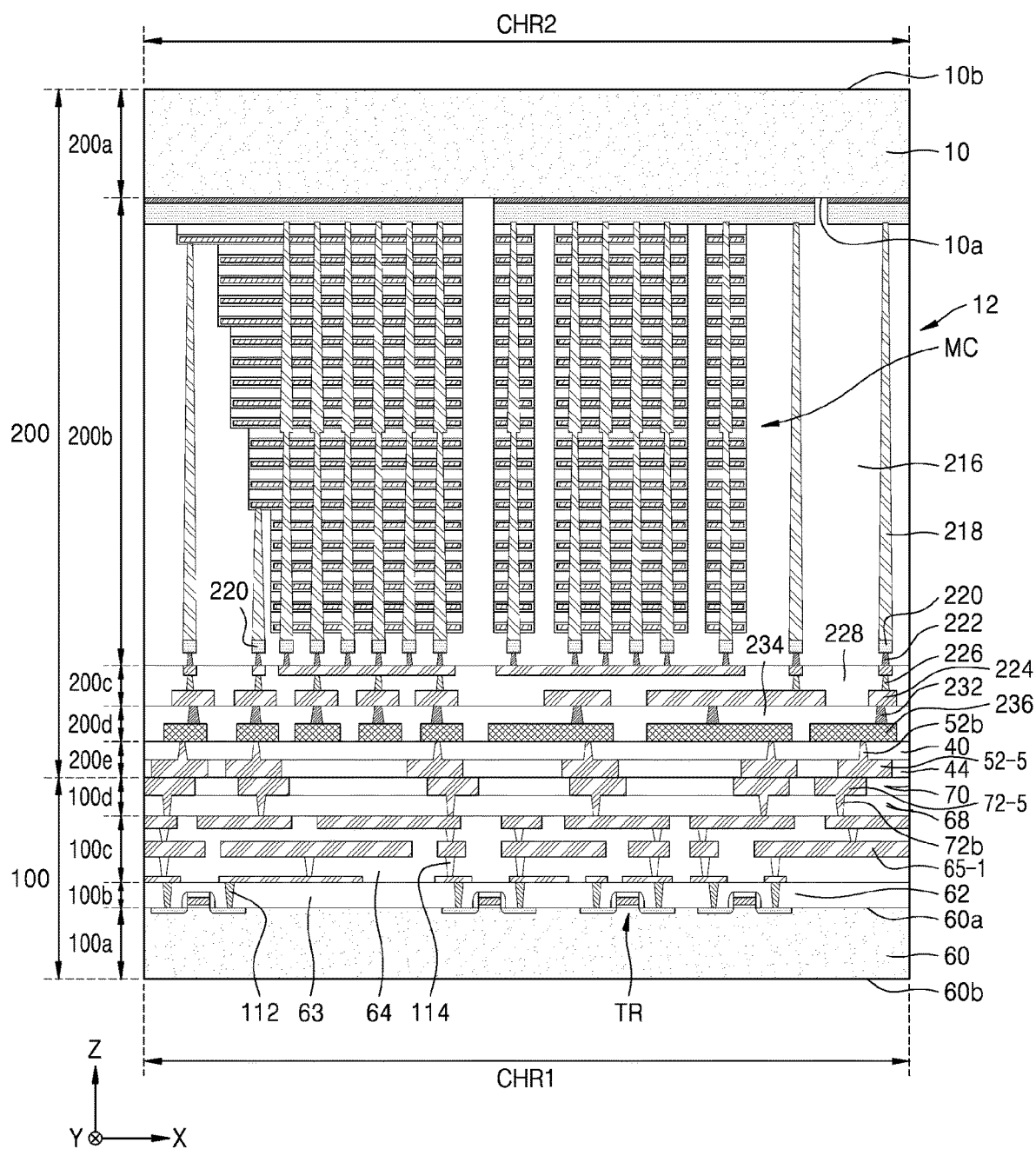

Referring to FIG. 26, in some embodiments, the second semiconductor chip 200 previously prepared is then turned on and positioned above the first semiconductor chip 100. Then, the first bonding electrode 52-5 and the second bonding insulating layer 44, which have the second bonding surface b2, are hybrid bonded to respectively match the first bonding electrode 72-5 and the first bonding insulating layer 70, which have the first bonding surface b1. The first bonding surface b1 and the second bonding surface b2 are flat, and thus the first and second bonding surfaces b1 and b2 can be easily bonded together.

Subsequently, in some embodiments, as needed, as shown in FIG. 22, the back surface of the second substrate 10 is polished to reduce a thickness thereof. Then, the second external connection terminal 213 is on the back surface 10b of the second substrate 10 and is connected to the conductive layers 212 and 214 of the second circuit 12.

In addition, in some embodiments, as needed, as shown in FIG. 22, the first external connection terminal 118 is formed on the back surface 60b of the first substrate 60 and connected through the first final wiring pattern 65-1 and the penetration via 116. Any one of the second external connection terminal 213 and the first external connection terminal 118 may selectively be formed.

Figure 27:
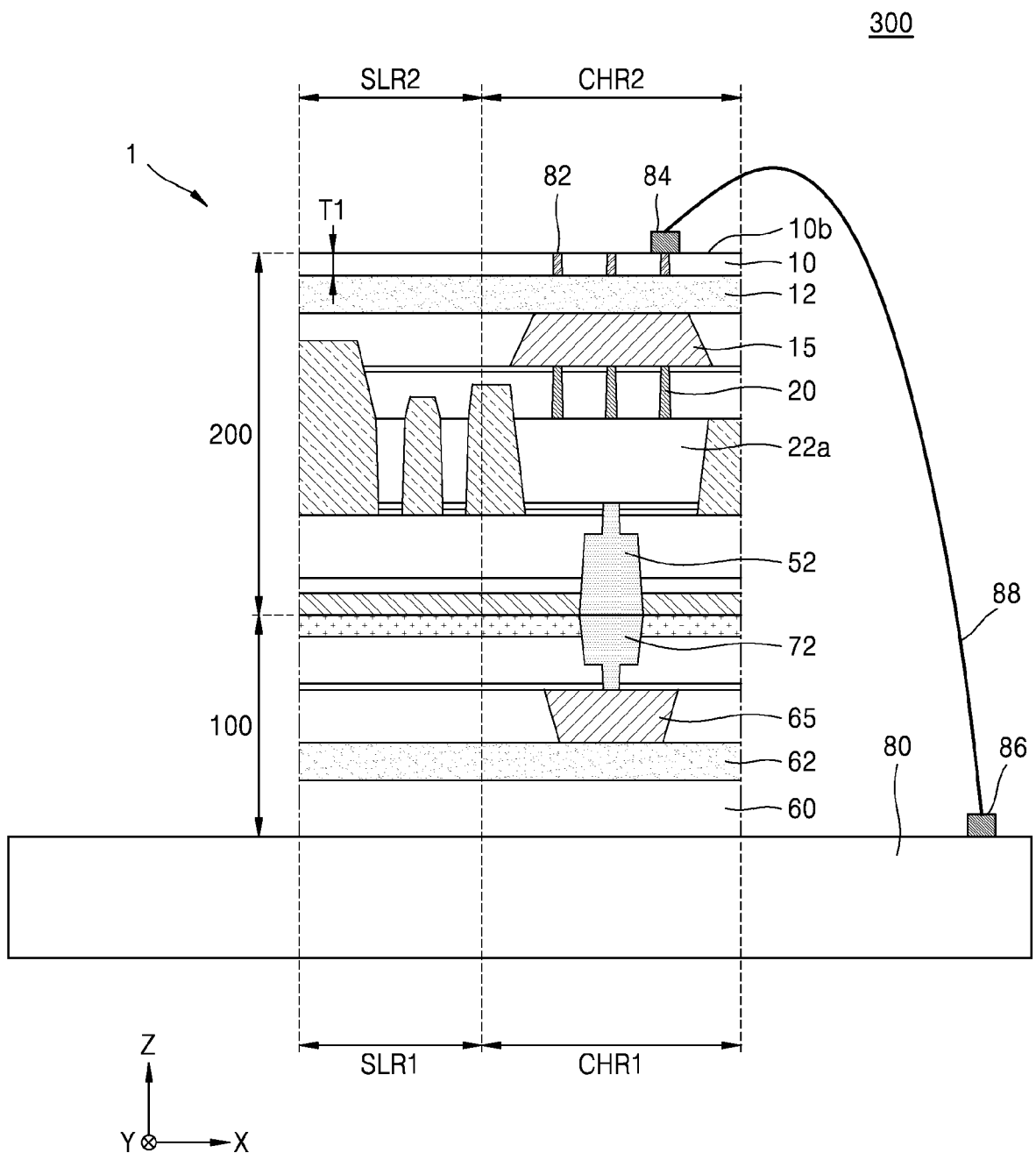
FIG. 27 is a cross-sectional view of a semiconductor package that includes a semiconductor chip structure of FIGS. 1 and 2, according to an embodiment of the inventive concept.

FIG. 27 is a cross-sectional view of an embodiment of a semiconductor package that includes a semiconductor chip structure of FIGS. 1 and 2.

In FIG. 27, the same reference numerals as those in FIGS. 1 and 2 will indicate the same members. In FIG. 27, a description of the same components as those in FIGS. 1 and 2 will be summarized or omitted. In some embodiments, a semiconductor package 300 is constructed by mounting the semiconductor chip structure 1 to a circuit substrate 80, for example, a printed circuit board (PCB) substrate.

In some embodiments, the semiconductor chip structure 1 has the second semiconductor chip 200 bonded onto the first semiconductor chip 100. Compared with FIG. 1, FIG. 27 shows that some of the first scribe lane region SLR1 and the second scribe lane region SLR2 are partially cut in the first semiconductor chip 100 and the second semiconductor chip 200, respectively.

In the semiconductor package 300, in some embodiments, an external connection via 82 is formed within the second substrate 10. The external connection via 82 is electrically connected to the second circuit 12. A thickness T1 of the second substrate 10 may be reduced from that of the second substrate 10 in FIGS. 1 and 2, due to a polishing process, as needed. An external connection terminal 84 is formed on the external connection via 82. The external connection terminal 84 is electrically connected to a substrate connection terminal 86 formed on the circuit substrate 80 through a wire 88.

Figure 28:
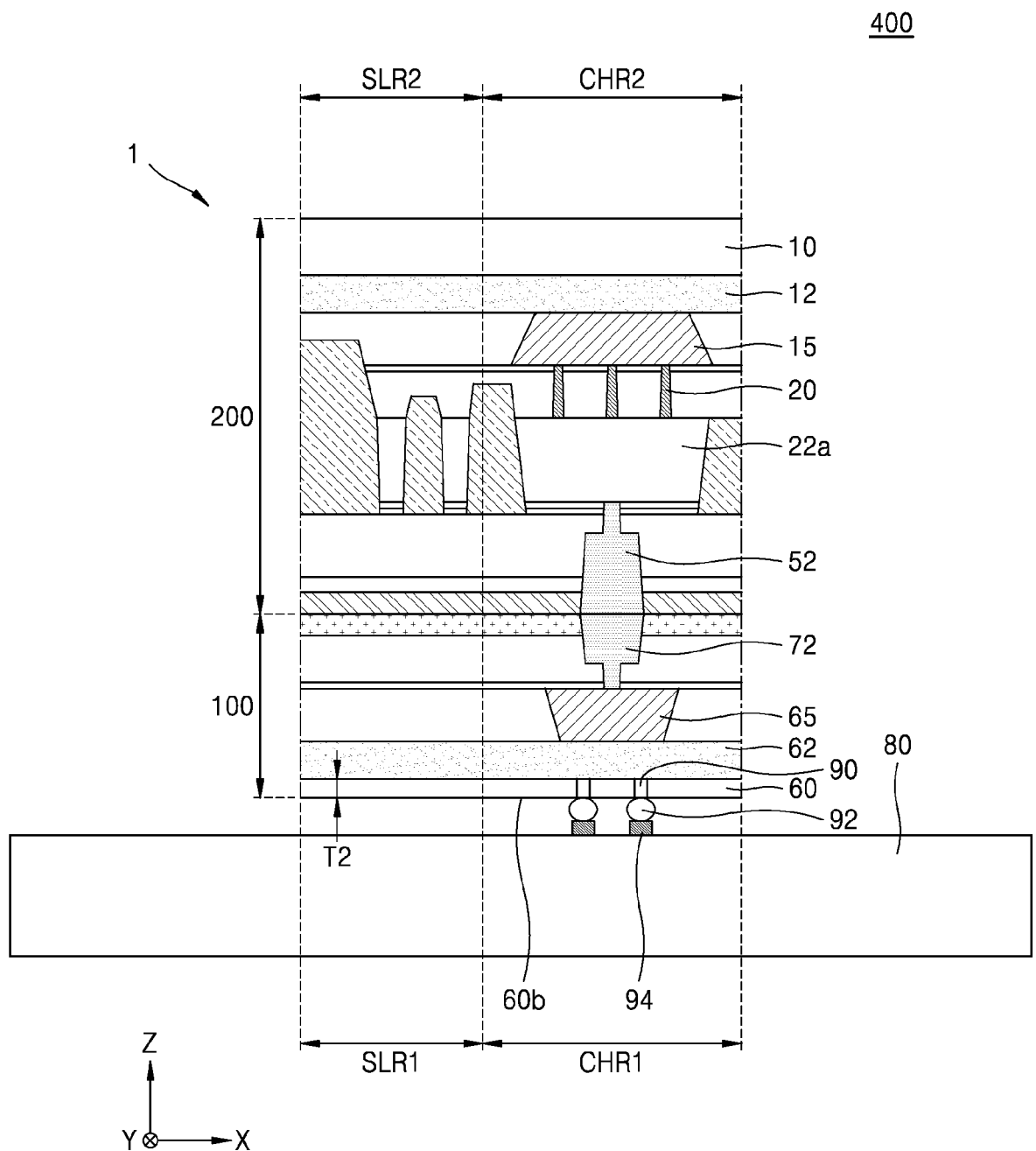
FIG. 28 is a cross-sectional view of a semiconductor package that includes a semiconductor chip structure of FIGS. 1 and 2, according to an embodiment of the inventive concept.

FIG. 28 is a cross-sectional view of an embodiment of a semiconductor package that includes a semiconductor chip structure of FIGS. 1 and 2.

In FIG. 28, the same reference numerals as those in FIGS. 1 and 2 will indicate the same members. In FIG. 28, a description of the same components as those in FIGS. 1 and 2 will be summarized or omitted. A semiconductor package 400 is constructed by mounting the semiconductor chip structure 1 onto the circuit substrate 80, such as a PCB substrate.

In some embodiments, the semiconductor chip structure 1 has the second semiconductor chip 200 bonded on the first semiconductor chip 100. Compared with FIG. 1, FIG. 28 shows that some of the first scribe lane region SLR1 and the second scribe lane region SLR2 are partially cut in the first semiconductor chip 100 and the second semiconductor chip 200, respectively.

In the semiconductor package 400, in some embodiments, an external connection via 90 is formed within the second substrate 60. The external connection via 90 is electrically connected to the first circuit 62. A thickness T2 of the first substrate 60 may be reduced to be less than that of the first substrate 60 in FIGS. 1 and 2 due to a polishing process, as needed. An external connection terminal 92 is formed on the external connection via 90. The external connection terminal 92 includes a conductive bump. The external connection terminal 92 may include aluminum, gold, solder, and the like. The external connection terminal 92 is electrically and directly connected to a substrate connection terminal 94 on the circuit substrate 80.

Figure 29:
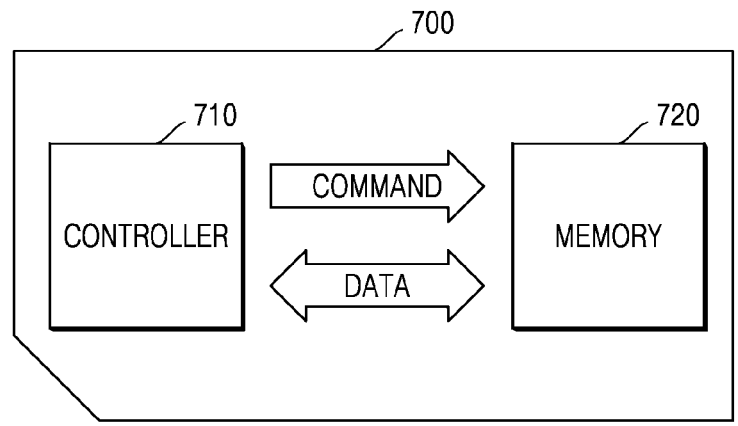
FIG. 29 is a block diagram of a memory card that includes a semiconductor package that includes a semiconductor chip structure according to an embodiment of the inventive concept.

FIG. 29 is a block diagram of a memory card that incorporates a semiconductor package that includes a semiconductor chip structure according to an embodiment of the inventive concept.

Specifically, in some embodiments, a controller 710 and a memory 720 in a memory card 700 are arranged to exchange electrical signals. For example, when the controller 710 gives a command, the memory 720 may transmit data. The controller 710 and/or the memory 720 include a semiconductor package that incorporates a semiconductor chip structure according to an embodiment of the inventive concept. Examples of semiconductor packages are shown in FIGS. 22 and 23. The memory 720 may include a memory array or a memory array bank.

The memory card 700 can be used in various types of cards, such as memory devices such as memory stick cards, smart media (SM) cards, secure digital (SD) cards, mini secure digital (mini SD) cards, or multi media cards (MMC).

Figure 30:
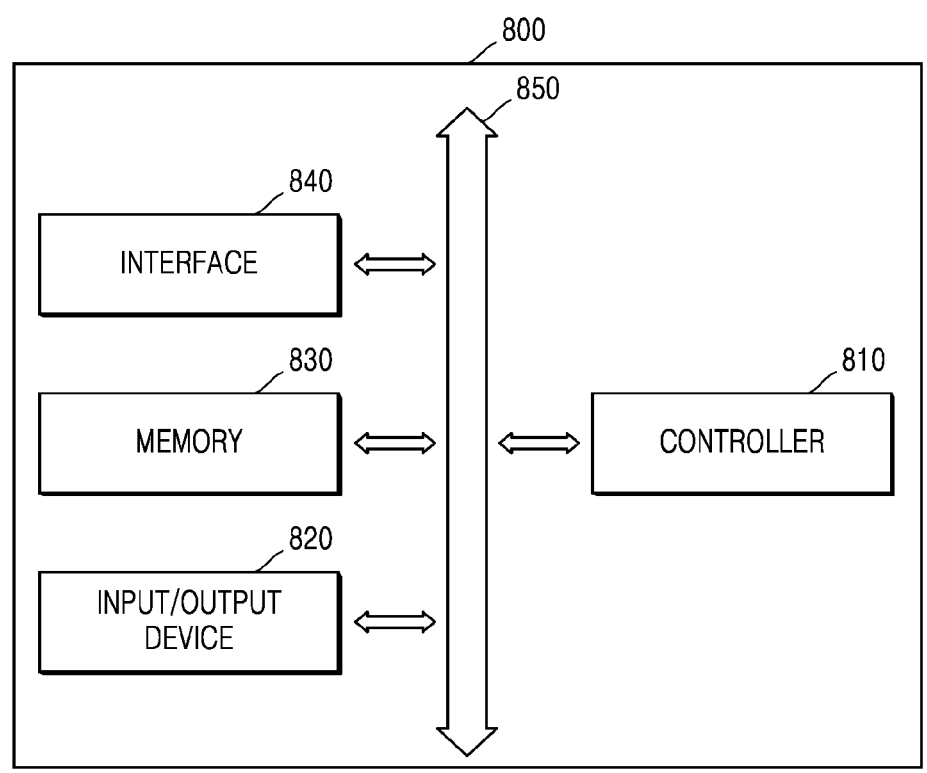
FIG. 30 is a block diagram of an electronic system that includes a semiconductor package that includes a semiconductor chip structure according to an embodiment of the inventive concept.

FIG. 30 is a block diagram of an electronic system that incorporates a semiconductor package that includes a semiconductor chip structure according to an embodiment of the inventive concept.

Specifically, in some embodiments, an electronic system 800 includes a controller 810, an input/output device 820, a memory 830, and an interface 840. The electronic system 800 may be a mobile system or a system that transmits or receives information. The mobile system may be a personal digital assistant (PDA), a portable computer, a web tablet, a wireless phone, a mobile phone, a digital music player, or a memory card.

In some embodiments, the controller 810 can execute a program and control the electronic system 800. The controller 810 may include, for example, a microprocessor, a digital signal processor, a microcontroller, or a similar device thereof. The input/output device 820 can input or output data of the electronic system 800.

In some embodiments, the electronic system 800 is connected to an external device, such as a personal computer or a network that uses the input/output device 820, and exchanges data with the external device. The input/output device 820 may include, for example, a keypad, a keyboard, or a display device. The memory 830 can store code and/or data for the operation of the controller 810, and/or store data processed by the controller 8100.

In some embodiments, the controller 810 and the memory 830 include a semiconductor package that incorporates a semiconductor chip structure according to an embodiment of the inventive concept. Examples of semiconductor packages are shown in FIGS. 22 and 23. The interface 840 is a data transmission passage between the electronic system 800 and another external device. The controller 810, the input/output device 820, the memory 830, and the interface 840 can communicate with each other via a bus 850.

For example, the electronic system 800 may be used in a mobile phone, a MP3 player, a navigation device, a portable multimedia player (PMP), a solid state disk (SSD), or household appliances.

While the inventive concept has been particularly shown and described with reference to embodiments thereof, it will be understood that various changes in form and details may be made therein without departing from the spirit and scope of the following claims.

What is claimed is:

1. A semiconductor chip structure, comprising:
   a first semiconductor chip that includes a first chip region and a first scribe lane region; and
   a second semiconductor chip that includes a second chip region and a second scribe lane region respectively bonded to the first chip region and the first scribe lane region on the first semiconductor chip, wherein
   the first semiconductor chip further includes a first final wiring layer that includes a first final wiring pattern and a first passivation layer that insulates the first final wiring pattern; and
   a first bonding wiring layer formed on the first final wiring layer, wherein the first bonding wiring layer includes a first bonding insulating layer and a first bonding electrode formed in the first bonding insulating layer, and
   the second semiconductor chip further includes an intermediate wiring layer that includes an intermediate wiring pattern and an intermediate wiring insulating layer that insulates the intermediate wiring pattern,
   a second final wiring layer formed on the intermediate wiring layer, wherein the second final wiring layer includes a second final wiring pattern, a polishing stop pattern formed on the second final wiring pattern, and a second passivation layer that insulates both the second final wiring pattern and the polishing stop pattern, wherein the second passivation layer covers side surfaces of the second final wiring pattern and the polishing stop pattern, but not bottom or top surfaces of the second final wiring pattern and the polishing stop pattern, and the second final wiring pattern is electrically connected to the intermediate wiring pattern; and
   a second bonding wiring layer formed on the second final wiring layer, wherein the second bonding wiring layer includes a second bonding insulating layer and a second bonding electrode formed in the second bonding insulating layer and the polishing stop pattern,
   wherein the second bonding wiring layer, the second final wiring layer and the intermediate wiring layer are sequentially stacked, and
   wherein the first bonding insulating layer and the first bonding electrode in the first bonding wiring layer are respectively hybrid bonded to the second bonding insulating layer and the second bonding electrode in the second bonding wiring layer.

2. The semiconductor chip structure of claim 1, wherein the polishing stop pattern includes at least one of a metal pattern, an insulating pattern, or a combination thereof.

3. The semiconductor chip structure of claim 1, wherein surfaces of the first final wiring pattern and the first passivation layer form a first flat surface with no step difference between the first chip region and the first scribe lane region.

4. The semiconductor chip structure of claim 1, further comprising an etch stop layer on the first final wiring pattern and the first passivation layer.

5. The semiconductor chip structure of claim 1, wherein surfaces of the polishing stop pattern and the second passivation layer form a second flat surface with no step difference between the second chip region and the second scribe lane region.

6. The semiconductor chip structure of claim 1, wherein the first final wiring pattern includes a different metal from that of the first bonding electrode.

7. The semiconductor chip structure of claim 1, wherein the second final wiring pattern includes a different metal from that of the second bonding electrode.

8. The semiconductor chip structure of claim 1, wherein the first bonding insulating layer and the second bonding insulating layer include at least one of a silicon carbon nitride (SiCN) film, a silicon oxycarbonitride (SiOCN) film, a silicon boron nitride (SiBN) film, a silicon oxide (SiO) film, or a boron nitride (BN) film.

9. The semiconductor chip structure of claim 1, wherein
   the first bonding electrode is electrically connected to the first final wiring pattern, and
   the second bonding electrode is electrically connected to the second final wiring pattern.

10. A semiconductor chip structure, comprising:
    a first semiconductor chip that includes a first chip region and a first scribe lane region; and
    a second semiconductor chip that includes a second chip region and a second scribe lane region respectively bonded to the first chip region and the first scribe lane region on the first semiconductor chip, wherein
    the first semiconductor chip further includes a first circuit layer, a first final wiring layer and a first bonding wiring layer that are sequentially stacked,
    wherein the first circuit layer is formed on the first chip region and the first scribe lane region;
    wherein the first final wiring layer includes a first final wiring pattern and a first passivation layer that insulates the first final wiring pattern; and
    wherein the first bonding wiring layer includes a first interlayer insulating layer, a first bonding insulating layer formed on the first interlayer insulating layer, and a first bonding electrode formed in the first interlayer insulating layer and the first bonding insulating layer, and
    the second semiconductor chip further includes a second circuit layer, a second final wiring layer and a second bonding wiring layer that are sequentially stacked,
    wherein the second circuit layer is formed on the second chip region and the second scribe lane region;
    wherein the second final wiring layer includes a second final wiring pattern, a polishing stop pattern formed on the second final wiring pattern, and a second passivation layer that insulates both the second final wiring pattern and the polishing stop pattern, wherein the second passivation layer covers side surfaces of the second final wiring pattern and the polishing stop pattern, but not bottom or top surfaces of the second final wiring pattern and the polishing stop pattern; and
    wherein the second bonding wiring layer includes a second interlayer insulating layer, a second bonding insulating layer formed on the second interlayer insulating layer, and a second bonding electrode formed in the second interlayer insulating layer and the polishing stop pattern,
    wherein the first bonding insulating layer and the first bonding electrode of the first bonding wiring layer are respectively hybrid bonded to the second bonding insulating layer and the second bonding electrode of the second bonding wiring layer.

11. The semiconductor chip structure of claim 10, wherein the first circuit layer includes a peripheral circuit, and the second circuit layer includes a memory cell.

12. The semiconductor chip structure of claim 10, wherein the first bonding electrode includes a first planar electrode and a plurality of first via electrodes electrically connected to the first planar electrode, wherein each of the first via electrodes is electrically connected to the first final wiring pattern.

13. The semiconductor chip structure of claim 10, wherein a width of the first bonding electrode differs from a width of the second bonding electrode.

14. The semiconductor chip structure of claim 10, further comprising
an intermediate wiring pattern electrically connected to the second final wiring pattern and
an intermediate wiring insulating layer that insulates the intermediate wiring pattern, formed on the second circuit layer.

15. The semiconductor chip structure of claim 10, further comprising an adhesive layer formed between the second interlayer insulating layer and the second bonding insulating layer.

16. The semiconductor chip structure of claim 10, wherein
surfaces of the first final wiring pattern and the first passivation layer form a first flat surface with no step difference between the first chip region and the first scribe lane region, and
surfaces of the polishing stop pattern and the second passivation layer form a second flat surface with no step difference between the second chip region and the second scribe lane region.

* * * * *